(12) United States Patent
Kim et al.

(10) Patent No.: US 11,588,324 B2
(45) Date of Patent: Feb. 21, 2023

(54) ELECTRICAL FAULT DETECTION AND RECOVERY POWER DISTRIBUTION SYSTEM AND ITS CONSTRUCTION METHOD

(71) Applicants: ITE CO., LTD., Uijeongbu-si (KR); Na Woon Kim, Yangju-si (KR); RF DEVICES, INC., Icheon-si (KR)

(72) Inventors: Na Woon Kim, Yangju-si (KR); In Tae Kim, Yangju-si (KR)

(73) Assignees: Na Woon Kim, Yangju-s (KR); ITE CO., LTD., Uijeongbu-si (KR); RF DEVICES, INC., Icheon-si (KR)

( * ) Notice: Subject to any disclaimer, the term of this patent is extended or adjusted under 35 U.S.C. 154(b) by 34 days.

(21) Appl. No.: 17/093,212

(22) Filed: Nov. 9, 2020

(65) Prior Publication Data

US 2021/0098985 A1 Apr. 1, 2021

Related U.S. Application Data

(63) Continuation of application No. PCT/KR2019/005451, filed on May 8, 2019.

(30) Foreign Application Priority Data

May 9, 2018 (KR) .................. 10-2018-0053269

(51) Int. Cl.
*H02H 7/22* (2006.01)
*G01R 31/54* (2020.01)
(Continued)

(52) U.S. Cl.
CPC ............. *H02H 7/22* (2013.01); *G01R 31/086* (2013.01); *G01R 31/52* (2020.01); *G01R 31/54* (2020.01); *G01R 31/66* (2020.01); *H02H 1/0015* (2013.01)

(58) Field of Classification Search
CPC .......... H02H 1/0015; H02H 3/16; H02H 5/10; H02H 7/22; H02H 7/26; G01R 31/086;
(Continued)

(56) References Cited

U.S. PATENT DOCUMENTS

2017/0166146 A1 6/2017 Kinoshita et al.

FOREIGN PATENT DOCUMENTS

JP    S53-072143 U    6/1978
JP    H07-143692 A    6/1995
(Continued)

OTHER PUBLICATIONS

Office Action issued in KR 10-2018-0053269; mailed by the Korean Intellectual Property Office dated Sep. 23, 2019.
(Continued)

*Primary Examiner* — Kevin J Comber
(74) *Attorney, Agent, or Firm* — Studebaker & Brackett PC

(57) ABSTRACT

Disclosed is a power distribution system for detecting and repairing all electrical faults, which performs at least one of immediate alarming, breaking, repairing, notifying, monitoring, and controlling according to a faulty section, place, and position where a fault occurred, if a resistance increase, an arc, an open phase, a connection failure, a partial wire disconnection, an incorrect wire connection, an abnormal voltage input, an electric leakage, a short circuit, a power imbalance occurs in three-phase or single-phase electrical equipment or in the present power distribution system.

22 Claims, 13 Drawing Sheets

(51) Int. Cl.
 *G01R 31/66* (2020.01)
 *G01R 31/52* (2020.01)
 *G01R 31/08* (2020.01)
 *H02H 1/00* (2006.01)

(58) Field of Classification Search
 CPC ........ G01R 31/52; G01R 31/54; G01R 31/66; H02J 3/00; Y04S 10/52
 USPC .......................................................... 361/42
 See application file for complete search history.

(56) References Cited

FOREIGN PATENT DOCUMENTS

| | | |
|---|---|---|
| JP | 2000-164107 A | 6/2000 |
| JP | 2002-044861 A | 2/2002 |
| JP | 2003-309033 A | 10/2003 |
| JP | 2007-116774 A | 5/2007 |
| JP | 2009-111028 A | 5/2009 |
| JP | 2011-015504 A | 1/2011 |
| KR | 10-2009-0004718 A | 1/2009 |
| KR | 10-1109024 B1 | 2/2012 |
| KR | 10-2013-0044247 A | 5/2013 |
| KR | 2013044247 A * | 5/2013 |
| KR | 10-20150128124 A | 11/2015 |
| KR | 10-2016-0053514 A | 5/2016 |
| KR | 10-1665952 B1 | 10/2016 |
| KR | 1665952 B1 * | 10/2016 ............. G01R 13/00 |
| KR | 10-1803431 B1 | 12/2017 |
| KR | 1803431 B1 * | 12/2017 ........... G01R 19/165 |

OTHER PUBLICATIONS

International Search Report issued in PCT/KR2019/005451; dated Aug. 19, 2019.

The extended European search report issued by the European Patent Office dated Jan. 20, 2022, which corresponds to European Patent Application No. 196004968.8-1010 and is related to U.S. Appl. No. 17/093,212.

An Office Action; "Notice of Reasons for Rejection", mailed by the Japanese Patent Office dated Jan. 18, 2022, which corresponds to Japanese Patent Application No. 2021-513738 and is related to U.S. Appl. No. 17/093,212; with English language translation.

An Office Action mailed by the Indian Patent Office dated Sep. 10, 2021, which corresponds to Indian Patent Application 202027051417 and is related to U.S. Appl. No. 17/093,212.

\* cited by examiner

FIG. 8

SUPPLEMENTARY (RECOVERY) CURRENT SUPPLIED ACCORDING TO INCREASE IN RESISTANCE

○ $V=IR$, $I=V/R$, $R=V/I$   ○ $W=VI$, $I=W/V$, $V=W/I$   ○ $W=VA=P$

| CLASSIFICATION | | | VOLTAGE : 220V | | | | | | | | |
|---|---|---|---|---|---|---|---|---|---|---|---|
| NORMAL STATE | LOAD CAPACITY (W) | 0 | 400 | 500 | 750 | 1000 | 1250 | 1500 | 2000 | 3000 | 5000 |
| | RESISTANCE (Ω) | 0 | 121.0 | 96.8 | 64.5 | 48.4 | 38.7 | 32.3 | 24.2 | 16.1 | 9.7 |
| | CURRENT (mA) | 0 | 1,818 | 2,273 | 3,409 | 4,545 | 5,682 | 6,818 | 9,091 | 13,636 | 22,727 |
| POWER SUPPLY LINE INCREASE IN RESISTANCE (Ω) | INCREASE IN RESISTANCE VALUE | | SUPPLEMENTARY (RECOVERY) CURRENT (mA) | | | | | | | | |
| | 0 | 0 | 0 | 0 | 0 | 0 | 0 | 0 | 0 | 0 | 0 |
| | 0.2 | 0 | 3.0 | 4.7 | 10.6 | 16.8 | 29.3 | 42.3 | 75.1 | 169.0 | 466.6 |
| | 0.5 | 0 | 7.5 | 11.7 | 26.4 | 47.0 | 73.4 | 105.7 | 187.8 | 422.6 | 1,173.9 |
| | 1 | 0 | 15.0 | 23.5 | 52.8 | 93.9 | 146.7 | 211.3 | 375.7 | 845.2 | 2,347.9 |
| | 2 | 0 | 30.1 | 47.0 | 105.7 | 187.8 | 293.5 | 422.6 | 751.3 | 1,690 | 4,695.7 |
| | 3 | 0 | 45.1 | 70.4 | 158.5 | 218.7 | 440.2 | 633.9 | 1,127.0 | 2,535.7 | 7,043.6 |
| | 4 | 0 | 60.1 | 93.9 | 211.3 | 375.7 | 587.0 | 845.2 | 1,502.6 | 3,380.9 | 9,391.4 |
| | 5 | 0 | 75.1 | 117.4 | 264.1 | 469.6 | 733.7 | 1,056.5 | 1,878.3 | 2,226.1 | 11,739.3 |
| | 6 | 0 | 90.2 | 140.9 | 317.0 | 563.5 | 880.4 | 1,267.8 | 2,253.9 | 5,071.4 | 14,087.2 |
| | 7 | 0 | 105.2 | 164.4 | 369.8 | 657.4 | 1,027.2 | 1,479.2 | 2,629.6 | 5,916.6 | 16,435.0 |
| | 8 | 0 | 120.2 | 187.8 | 422.6 | 751.3 | 1,173.9 | 1,690.5 | 3,005.3 | 6,761.8 | 18,782.9 |
| | 9 | 0 | 135.2 | 211.3 | 475.4 | 845.2 | 1,320.7 | 1,901.8 | 3,380.0 | 7,607.1 | 21,130.7 |
| | 10 | 0 | 150.3 | 234.8 | 528.3 | 939.1 | 1,467.7 | 2,113.1 | 3,756.6 | 8,452.3 | 23,487.0 |
| | ∞ | 0 | 0 | 0 | 0 | 0 | 0 | 0 | 0 | 0 | 0 |

ELECTRICAL FAULT DETECTION AND RECOVERY POWER DISTRIBUTION SYSTEM AND ITS CONSTRUCTION METHOD

TECHNICAL FIELD

The present disclosure relates to a power distribution system for detecting and repairing all electrical faults, capable of preventing an electric shock, fire, and power failure by detecting electrical faults such as an increase in resistance, an arc, an open phase, an electric leakage, a partial wire disconnection, a connection failure, and an abnormal voltage inflow in each electrical equipment including a detection/recovery unit in real time, generating electrical signals due to the electrical faults according to a faulty section, fault place, and equipment location, and performing breaking, repairing, notifying, monitoring, and controlling or recovering a fault power, when such electrical faults occur in electrical equipment using three-phase or single-phase power, in the present power distribution system, or in a power line (electric line, bus duct, etc.), and a construction method therefor.

BACKGROUND ART

In general, electrical equipment refers to machinery, equipment, dams, waterways, reservoirs, electric lines, security communication lines, and other equipment installed for power generation, transmission, substation, distribution, or electricity use. Electrical equipment for electric business, general electrical equipment, and private electrical equipment correspond to electrical equipment. As an example of the electrical equipment, a three-phase four-wire power distribution system supplies power by combining a neutral line N and a power line (R phase, S phase, and T phase) through a method such as Y connection, delta connection, Y delta connection, and the like. Here, in the case of load connection, connecting one power line and another power line forms 380 V, and connecting one power line (e.g., A phase) and a neutral line N forms 220 V to supply power to a single-phase load.

Here, the neutral line N indicates a line which commonly processes a line on one side of each phase in a multi-phase multi-wire line. Although six strands of electric wires are needed in principle to use three phases, if the lines on one sides are commonly processed by shifting the phases of single-phase two-wire lines as much as 120° respectively, the wires are reduced to four strands, and the potential of the commonly processed point becomes zero (0) by vector sum. The zero potential (null potential) like this becomes a reference potential, which becomes the so-called N phase, i.e., the neutral line.

In this state, although the neutral line should have a null potential, i.e., a ground potential, in principle, the neutral line may have a small voltage when the phase of each of the RST phases does not actually become exactly 120° in the field. At this point, if the neutral line is commonly connected to the earth line, which is a ground potential line, to prevent a rise in the potential of the neutral line, the null potential is maintained although there is a small difference in the phase of each of the RST phases when the neutral line comes into contact with the earth.

Here, two connected wires are used in a single-phase distribution line, and since one of the two wires is connected to the neutral line, which has a potential equal to that of the earth, and the other wire is connected to a power line having a potential difference of 220 V with the earth, if an electric leakage (grounding) occurs in the power line, the risk of death by electric shock or outbreak of a fire is very high.

In addition, if the neutral line on the power supply side, to which a single-phase load is commonly connected, is disconnected, an abnormal voltage flows into a light load due to unbalanced loads different from each other through the neutral line commonly connected to an unbalanced single-phase load connected to a different phase of the three phases, and thus overheat burning damage of an electric device and outbreak of a fire caused by the overheating frequently occur, and in addition, a zero harmonic flowing into the neutral line causes an abnormal over current to flow in the neutral line, bringing about an electrical accident. In order to prevent this, a molded case circuit breaker (MCCB) and an electric leakage breaker (ELB) are installed.

The MCCB, which refers to a circuit breaker which protects an overload flowing in a wire and a short circuit, is generally accommodated in a molded case, and is used to protect wires in a circuit of low indoor voltage of AC 600 V or lower or DC 250 V or lower. Generally, the circuit breaker is also called the MCCB.

In addition, the electric leakage breaker (ELB) is a device for preventing electric shock by sensing a leakage current of about 5 to 30 mA. Most fuses or MCCBs operate at a high current of about a few amperes (A). Thus, the ELB should be used to prevent electric shock accidents caused by a small leakage current and is supposed to detect a leakage current of about 5 to 30 mA and break a circuit within 25 to 40 msec to prevent the electric shock from reaching the heart of a victim and leading to a death from electric shock. The leakage current which becomes a reference of breaking varies depending on the country and region, and in Korea, it is limited to one-two thousandth of a rated current. If the rated current of an ELB is 100 A, a leakage current thereof is within 50 mA.

A general ELB measures a difference between an outgoing current to a power line and an incoming current into a neutral line. If the sum of the outgoing current and the incoming current is not zero, it means that the current is leaking somewhere. At this point, the ELB operates to cut off the leakage current. The ELB is in a complementary relation with a circuit breaker which cuts off high current. Since an overload or a short circuit cannot be prevented using only the circuit breaker dedicated to an electric leakage, a circuit breaker for cutting off both overcurrent (short circuit) and electric leakage is used in most cases.

In addition, an ELB for cutting off a leakage current of 500 mA or higher is installed in an environment of a data center or the like which may be operated due to an accident when an interrupt current is low. Such an electric leakage breaker is installed for fire protection, rather than for an electric shock protection.

However, electric fires do not decrease every year, and most of the fires occur in low-voltage consumers, rather than high-voltage consumers, because of poor electrical facilities of the low-voltage consumers. When a neutral line-disconnected electricity or open phase electricity is supplied from a distribution line, when electricity of incorrect connection is supplied, when an abnormal voltage such as a surge voltage is supplied, or when electrical fault such as an increase in resistance, a connection failure (arc), or the like, occurs in an electrical equipment of a consumer, the low-voltage consumer cannot do something about the electrical fault, and thus an abnormal voltage may be introduced into a load, or electrical equipment is overheated or burned, resulting in an electric shock or electric fire.

In addition, an area from an entrance for receiving electricity of a building of a low-voltage consumer to a distribution panel/switchboard where a circuit breaker is installed is a blind spot for electrical fault monitoring such as an electric leakage, and if an electric leakage accident occurs in this area, bodily injury and property damage occur due to electric shock and electric fire without any measures. There are various causes of such electric fires, and main factors thereof are as follows.

First, as a short circuit, if a cover (sheath) of a wire is peeled off, if a wire is fixed with nails, pins, or the like, or if a heavy item is placed on a movable wire, two strands of the wire come into contact with each other by direct or indirect resistance and a current may concentratively flow to a contact portion to which the current may easily flow, causing a short circuit phenomenon, and at this time, a spark occurs due to contact between conductors, leading to a fire.

In case of overload, when the amount of electricity larger than a rated capacity is excessively used or occurs due to an unbalanced current, heat is excessively generated from an electric wire, an electric device itself, or a connection part of a wiring mechanism and can potentially start a fire.

An unbalanced voltage occurs due to open phase, disconnection, and fault of a load device in balanced loads (three-phase motors, etc.), when a power side neutral line of an unbalanced single-phase load of a three-phase four-wire system or single-phase three-wire system is disconnected or when a load device has a fault. An overcurrent of a three-phase balanced load may be protected to a degree by an electronic over current relay (EOCR), but if open phase abnormality occurs or a neutral line is disconnected in a control power at an initial stage (delay time) of starting a motor, it is not easy to protect the overcurrent due to supply abnormality of control power of the ECOR or the like. In particular, if the neutral line is disconnected in the single-phase two-wire power side system, a power failure occurs on the load side and the relay (breaker) becomes inoperable, and if the power line is shorted, an electric shock may occur or overvoltage may be introduced to a consumer who uses a small load so that there are no countermeasures for breaking fault electricity even in the event of electrical equipment damage, overheating, or a fire.

An electric leakage refers to an electrical circuit in which electricity flows to the outside through an object other than a conductive wire. As a current flows to a building, auxiliary facilities, etc. without passing through a part designed as a passage to accumulate heat, heat accumulation can cause a short circuit fire.

Connection failure and partial wire disconnection occur as a connection point (branch of circuit, etc.) of an electric wire or a conductor in an electric wire is disconnected. In this case, as connection and disconnection are repeated, an arc and resistance occur to cause a hindrance to a current flow. When such a hindrance is accumulated for a predetermined period of time or longer, a sheath of the electric wire is carbonized and positive (+) and negative (−) electrodes, which are conductors of the electric wire, collide with each other to cause a fire.

In addition, when overheating occurs as resistance of the conductor is increased due to an increase in resistance, carbonization (deterioration), and the like, an electric shock or fire occurs, and as overheating proceeds, overcurrent, overvoltage, unbalanced power due to occurrence of a short circuit, an open phase, a disconnection, and the like may cause an electric fire, but there is no technology to detect an abnormality such as carbonization (deterioration) in converters, and the reality is that the latest inspection method relies on the naked eyes of an electrician, and here, a connection defect which may be partially detected will be described.

As described above, the causes of electric fires are various, and each fire cause is different in all of the accompanying physical phenomena, so the methods used to detect the causes of electric fires are all different and types of protection relays are also diverse.

For an example of detecting a connection failure, an existing device for detecting a connection failure and an electrical abnormal state generally detect a temperature, a change in voltage and current, a change in harmonic (VTHD, ITHD), and the like to detect a connection failure, and in such a related art, various electrical quality factors must be measured or a temperature sensing device must be separately installed, and definitively, an electrical phenomenon appearing when a connection failure occurs cannot be accurately analyzed and identified.

That is, in the related art for detecting through a change in harmonic, when a consumer uses a welding machine and arcing load, VTHD and ITHD may increase severely, and since the values may severely fluctuate even in a normal state according to a light load, a heavy load, and a peak load, it is not sure if it was caused due to a connection failure.

In addition, the related art for detecting a connection failure from a single factor of a voltage value or a current value also has a limitation in determining a connection failure if voltage and current sources are separated (consumers supplied separately by PT and CT).

The connection failure is a failure that occurs in a current flow as an arc occurs at a connection point of an electric wire (a branch of a circuit, etc.) and resistance is created. If the failure is accumulated for more than a predetermined period of time, a temperature may increase and the sheath (insulation material) of the electric wire is carbonized and softened to result in an electric confusion, that is, positive (+) and negative (−) electrodes of the electric wire collide with each other to lead to occurrence of a short circuit, damage from burning an electrical equipment, and even an electric fire.

Specifically, as resistance of a contact surface increases due to a connection failure of the wire, heat of a connection surface of conductor (wire) increases, and the heat of high temperature damages insulation between the conductors (wires), causing a short circuit between the conductors. In addition, an arc occurs due to contact between conductors, and the device is burned by the arc heat, which leads to even an electric fire.

So far, the development and supply of equipment that may prevent electrical accidents and fires due to short circuits, overcurrents, or electric leakage occurring at a load side of a switch (circuit breaker) have been generalized, but there is no circuit breaker (switch) for accurately performing detection or breaking in the event of an arc of a conductor, an increase in resistance, overheating, disconnection of the neutral line, open phase of a power line, unbalanced abnormal voltage inflow, partial wire disconnection, or connection failure or in the event of an incorrect wire connection, an electric leakage, a ground fault, or a short circuit on a power side.

That is, a lot of technologies for detecting short circuits, electric leakage (ground faults), overloads, and the like of the load side have been developed, but a technology for accurately detecting an electrical fault and breaking it and taking measures in the event of arcs, an increase in resistance, overheating, neutral line disconnection, open phase of power line, unbalanced abnormal voltage inflow, partial wire disconnection, or connection failure on the power side and the load side or in the event of an incorrect wire connection, an electric leakage, a ground fault, or a short circuit on the power side has not been developed. Therefore, the Korea Electric Power Corporation (KEPCO) checks distribution lines with naked eyes, while spending a lot of manpower/labor and budget with infrared (thermal imaging) cameras to find distribution lines with connection failures.

Therefore, a technology capable of accurately determining the electrical fault regarding the arcs, an increase in resistance, overheating, neutral line disconnection, open phase of power line, unbalanced abnormal voltage inflow, partial wire disconnection, or connection failure on the power side and the load side or in the event of an incorrect connection, an electric leakage, a ground fault, or a short circuit on the power side and preventing damage from burning an electric device, an electric fire, an electric shock, and a mortality event is more urgently required than ever.

Techniques conventionally proposed to solve the problems generated due to a connection failure, open phase, disconnection, unbalanced over voltage, and overcurrent are disclosed in Korean Laid-Open Publication No. 10-2009-0004718 (Published on Jan. 12, 2009) (Title of invention: Apparatus and method for detecting loose contact) (Hereinafter, referred to as "related art 1"), Korean Patent Registration No. 10-1109024 (Registered on Jan. 17, 2012) (Title of invention: Apparatus and method for detecting loose contact of watt hour meter) (Hereinafter, referred to as "related art 2"), Korean Patent Registration No. 10-1803431 (Registered on Nov. 24, 2017) (Title of invention: Real-time recovery transformer system and method of construction thereof in case of single-phase power line failure) (Hereinafter, referred to as "related art 3"), and Korean Laid-Open Publication No. 10-2015-0128124 (Published on Nov. 18, 2015) (Title of invention: Overcurrent relay) (Hereinafter, referred to as "related art 4").

The disclosed "related art 1"

may protect a user from the risk of fire by sensing a loose contact using changes in current effective value, power factor, current instantaneous value, harmonics or the like as an index and accordingly shutting down power. Since the loose contact is determined when two or more factors are satisfied among the five factors capable of sensing a loose contact, a loose contact is sensed more correctly. Furthermore, information on the power shutdown according to the loose contact is provided to a user terminal, so that a user at a remote site may easily recognize it.

The disclosed "related art 2"

includes a voltage and current detection unit detecting a voltage and a current supplied to a consumer, a power factor calculation unit calculating a power factor value for a preset total measurement time and a measurement time unit through the detected voltage and current values, a loose contact determination unit determining a loose contact when the power factor value calculated for the preset total measurement time and the measurement time unit continuously decreases in a range of a value smaller than a predetermined reference value, and an interface unit transmitting a loose contact signal to a remote server when a loose contact is determined by the loose contact determination unit, and it is configured to prevent burning damage of an electric device (watt hour meter) caused by a loose contact by preventing the loose contact of the watt hour meter.

The disclosed "related art 3"

includes a power side transformer having a neutral point of the power side transformer and grounding the neutral point to the ground to thereby step down a potential difference with the ground than an existing potential difference; and at least two load side transformer having the neutral point and grounding the neutral point to the ground or connecting the neutral point to the neutral point of the power side transformer to recover a power side electrical fault in real time, whereby when a disconnection, loose contact, partial wire disconnection, and electric leakage occurs at a single-phase power side of a three-phase or single-phase power distribution system, an alarm may be immediately triggered, breaking may be immediately performed, or the disconnection may be recovered in real time, thereby preventing the occurrence of an electrical fault based on a power failure, an electric shock, a fire, and overheating due to a fault of the power distribution system.

The disclosed "related art 4"

is configured such that, in order to solve a problem of relay malfunction due to a normal change in a load, which is a limitation of the related art of the overcurrent relay, whether a change in a load is a normal change in the load is determined and whether to operate the relay is determined and the relay is operated according to the load state, whereby an appropriate relay operation based on the load state may be performed, a relay malfunction caused by a normally added load may be prevented, and line protection and system operation may be stably and reliably performed.

DISCLOSURE

Technical Problem

However, in the related arts as described above, the occurrence of arcs, the increase in resistance, and the like due to an error of electrical equipment or converters should be checked by the naked eye and there is no special detection method, so when overheating occurs due to arcs (connection failure), the increase in resistance, and the like in hidden places such as embedded wiring, insulation breakdown proceeds, resulting in a disconnection, a power failure, an electric shock, an electric leakage, a short circuit and overheating, fires occur and bodily harm and property damage inevitably occur.

In addition, even when there are signs of abnormalities such as an increase in resistance, overheating, connection failure, and the like in places where several load circuits are configured, connection sections, and an electric line, a distribution panel, a control panel, and the like, separately configured in each floor, a faulty section, fault place, and fault location cannot be found and an increase in resistance, overheating, a connection failure, and the like progresses to develop to a disconnection, an open phase, imbalance, an abnormal voltage inflow, an electric leakage, a ground fault, a short circuit, and the like, resulting in the occurrence of an electric fire and an electric shock or burning damage, malfunction, or paralysis of electric facilities to cause bodily harm and property damage and interruption of power supply.

In addition, in the related art 3, in order to reduce a potential difference of a single-phase power, power should be supplied through electromagnetic induction using a transformer on a power side, which is safe but a capacity of the transformer should be equal to or larger than a capacity of a load. Also, in the case of several loads, the capacity of the transformer should be designed by calculating a total load capacity obtained by adding up all of capacities of the plurality of loads. If the power side transformer is broken down, power supply to the entire load is stopped, a product manufacturing cost and facility construction cost, facility area, and the like, are excessive, and in reality, it is difficult to apply the related art to low-voltage consumers in Korea in which the existing KEPCO lines with a potential difference of 220 V from the ground are drawn.

Therefore, a power distribution system for immediately providing a warning (notification), breaking, and recovering and supplying normal power according to sections, places, and locations where a symptom of fault power such as an arc, an increase in resistance, a disconnection, an open phase, unbalanced power, a connection failure, an incorrect wire connection, an electric leakage, a short circuit, or the like occurs in a power line (power line, bus duct, etc.) supplied at a power distribution system, a transformer, a switchboard (MCCB), a control panel, a distribution panel, an uninterruptible power supply system (UPS), an emergency power equipment (generator, etc.) outlet, or the like, which is a three-phase or single-phase electrical equipment, and occurs in the power distribution system (electrical equipment) itself, is required, and in order to solve the general problems that arise in the power distribution system of the related art, an aspect of the present disclosure provides a power distribution system capable of providing an alarm, performing breaking, performing recovery in real time, and performing control immediately when abnormal power such as an arc, an increase in resistance, a disconnection, an open phase, unbalanced power, a connection failure, an incorrect wire connection, an electric leakage, or a short circuit occurs in a bus duct, a power line, and the power distribution system itself supplied with power to a load in an electrical equipment such as three-phase four-wire (R, S, T, N) system, a three-phase three-wire system (R, S, T), or a single-phase two-wire (RN, SN, TN) system, thereby preventing occurrence of a large social disaster due to an electric accident such as burning damage, function paralysis, electric shock, fire, power failure, or the like, and being capable of performing detection (monitoring), breaking, notification (warning), recovery, and control regardless of load capacity.

Technical Solution

According to an aspect of the present disclosure, there is provided a power distribution system for detecting and repairing all electrical faults, including:

at least one of a power side detection/recovery unit connected in parallel to a power side of a power line and a neutral line, to which electrical equipment (e.g., a power distribution system, a transformer, an uninterruptible power supply system (UPS), an emergency power equipment (generator, charger, etc.), switchboard, a control panel, a distribution panel, a molded case circuit breaker (MCCB), a circuit breaker, an outlet, an electric line, a bus duct, etc.) is connected, and a load side detection/recovery unit connected in parallel to a load side in which the power line and the neutral line are connected to a load, wherein at least one of load equipments (e.g., an electric device, a home appliance, a lamp (lighting), emergency equipment, communication equipment, environment equipment, etc.) connected to the power line and the neutral line is configured to be linked to the load side detection/recovery unit, so that when an electrical fault due to an arc, an increase in resistance, a disconnection, an open phase, unbalanced power (abnormal voltage, abnormal current), connection failure, an incorrect wire connection, an electric leakage, or a short circuit occurs in any one of the electrical equipment, the power line, the neutral line, and the power side detection/recovery unit, the detection/recovery unit may detect the electrical fault according to a location of a faulty section, a fault place, and a fault circuit where the electrical fault occurs and perform at least one of detection (monitoring), recovery, breaking, alarming, notification (wiredly/wirelessly), monitoring, and control (remotely) on the location where the electrical fault occurs.

In the above, when the power distribution system, which is electrical equipment, is a three-phase power distribution system, the detection/recovery unit may include iron cores which are a first leg, a second leg, and a third leg and a first winding, a second winding, and a third winding which are coils, the first winding may be wound around the first leg, the second winding may be wound around the second leg, and the third winding may be wound around the third leg, a Y connection may be made, and a common line may be configured as a neutral point, one ends of the first winding, the second winding, and the third winding may be connected to the power line in parallel, the neutral point may be linked to at least one of the earth, a neutral line, a first neutral point, a second neutral point, and a fault detector to detect, break, or recover the electrical fault of the electrical equipment, the power side detection/recovery unit may have a primary coil, and in the case of having the primary coil, the power line and the neutral point may output power supplying a single-phase two-wire type, three-phase three-wire type, and three-phase four-wire type, a single-phase supply power may be output by stepping down an earth voltage, and when the power distribution system is a single-phase power distribution system, the detection/recovery unit may have an iron core which is a first leg and a first winding which is a coil, the first winding may be wound around the first leg, one end of the first winding may be connected in parallel to the power line and the other end thereof may be connected in parallel to the neutral line, a neutral point which is a tab or a common line may be configured between one end and the other end of the first winding, the neutral point may be linked to at least one of the neutral line, the first neutral point, the second neutral point, and the fault detector to detect, break, or recover the electrical fault of the electrical equipment, the detection/recovery unit may have a primary coil, and in the case of having the primary coil, single-phase power may be output from the power line and the neutral line, a potential difference of the single-phase power may be stepped down and supplied to the load, or power may be supplied from the single-phase power so that an earth voltage does not occur, thereby preventing an electric leakage, an electric shock, and a fire.

In the above, when the power distribution system is a three-phase power distribution system, the power side detection/recovery unit or the load side detection/recovery unit may include iron cores which are a first leg, a second leg, and a third leg and a first winding, a second winding, and a third winding which are coils, the first winding and the second winding may be wound around the first leg, the second winding may be wound around the second leg, and the third winding and the second winding may be wound around the third leg, one ends of the first winding, the second winding, and the third winding may be connected in parallel to a power line provided in the electrical equipment and the other ends of the first winding, the second winding, and the third winding are connected by a common line to configure a neutral point, and the neutral point may be linked to at least one of the earth, a neutral line, a first neutral point, a second neutral point, and a fault detector to detect, break, or recover an electrical fault of the electrical equipment, and when the power distribution system is a single-phase power distribution system, the power side detection/recovery unit or the load side detection/recovery unit may have an iron core which is a first leg and a first winding which is a coil, the first winding may be wound around the first leg, one end of the first winding may be connected in parallel to a power line provided in an electrical equipment and the other end thereof may be connected in parallel to a neutral line, a neutral point which is a tab or a common line may be configured between one end and the other end of the first winding, and the neutral point may be linked to at least one of the neutral line, the first neutral point, the second neutral point, and the fault detector to detect, break, or recover the electrical fault of the electrical equipment.

In the above, when the power distribution system is a three-phase power distribution system, the power side detection/recovery unit or the load side detection/recovery unit may include iron cores which are a first leg, a second leg, and a third leg and a first winding, a second winding, and a third winding which are coils, the first winding may be wound around the first leg in a forward direction and the second winding may be wound around the first leg in a reverse direction, the second winding may be wound around the second leg in the forward direction, the third winding may be wound around the third leg in the forward direction and the second winding may be wound around the third leg in the reverse direction, one ends of the first winding, the second winding, and the third winding may be connected in parallel to a power line provided in the electrical equipment and the other ends of the first winding, the second winding, and the third winding are connected by a common line to configure a neutral point, and the neutral point may be linked to at least one of the earth, a neutral line, a first neutral point, a second neutral point, and a fault detector to detect, break, or recover an electrical fault of the electrical equipment, and when the power distribution system is a single-phase power distribution system, the power side detection/recovery unit or the load side detection/recovery unit may have an iron core which is a first leg and a first winding and a second winding which are coils, the first winding and the second winding may be wound around the first leg, one end (+) of the first winding may be connected in parallel to a power line provided in an electrical equipment and the other end (−) of the second winding may be connected in parallel to a neutral line, the other end (−) of the first winding and one end (+) of the second winding may be connected to each other to configure a neutral point which is a common line, and the neutral point may be linked to at least one of the neutral line, the first neutral point, the second neutral point, and the fault detector to detect, break, or recover the electrical fault of the electrical equipment.

In the above, when the power distribution system is a three-phase power distribution system, the power side detection/recovery unit or the load side detection/recovery unit may include iron cores which are a first leg, a second leg, and a third leg and a first winding, a second winding, and a third winding which are coils, the first winding and the second winding may be wound around the first leg, the second winding may be wound around the second leg, and the third winding and the second winding may be wound around the third leg, one ends of the first winding, the second winding, and the third winding may be connected in parallel to a power line provided in the electrical equipment and the other ends of the first winding, the second winding, and the third winding are connected by a common line to configure a neutral point, the neutral point may be linked to at least one of the earth, a neutral line, a first neutral point, a second neutral point, and a fault detector, and a circuit breaker may be provided between the power side detection/recovery unit and the load side detection/recovery unit or between the electrical equipment (main voltage transformer) and the load side detection/recovery unit, and when the power distribution system is a single-phase power distribution system, the power side detection/recovery unit or the load side detection/recovery unit may have an iron core which is a first leg and a first winding which is a coil, the first winding may be wound around the first leg, one end of the first winding may be connected in parallel to a power line provided in an electrical equipment and the other end thereof may be connected in parallel to a neutral line, a neutral point which is a tab or a common line may be configured between one end and the other end of the first winding, the neutral point may be linked to at least one of the neutral line, the first neutral point, the second neutral point, and the fault detector, and a circuit breaker may be provided between the power side detection/recovery unit and the load side detection/recovery unit.

In the above, when the power distribution system is a three-phase power distribution system, the power side detection/recovery unit or the load side detection/recovery unit may include iron cores which are a first leg, a second leg, and a third leg and a first winding, a second winding, and a third winding which are coils, the first winding may be wound around the first leg in a forward direction and the second winding may be wound around the first leg in a reverse direction, the second winding may be wound around the second leg in the forward direction, the third winding may be wound around the third leg in the forward direction and the second winding may be wound around the third leg in the reverse direction, one ends of the first winding, the second winding, and the third winding may be connected in parallel to a power line provided in the electrical equipment and the other ends of the first winding, the second winding, and the third winding are connected by a common line to configure a neutral point, the neutral point may be linked to at least one of the earth, a neutral line, a first neutral point, a second neutral point, and a fault detector, and a voltage ratio of a coil voltage of the second winding, which is separately wound as three windings around the first leg, the second leg, and the third leg, with respect to the first winding and the third winding is ½, and when the power distribution system is a single-phase power distribution system, the power side detection/recovery unit or the load side detection/recovery unit may have an iron core which is a first leg and a first winding which is a coil, the first winding may be wound around the first leg, one end of the first winding may be connected in parallel to a power line provided in an electrical equipment and the other end thereof may be connected in parallel to a neutral line, a neutral point, which is a common line, may be configured between the one end and the other end of the first winding, and the neutral point may be linked to at least one of the neutral line, the first neutral point, the second neutral point, and the fault detector to include a coil which is the winding that outputs a corresponding voltage or current in the case of an electrical fault of the electrical equipment.

In the above, a first neutral point may be configured in the power side detection/recovery unit and a second neutral point may be configured in the load side detection/recovery unit, and in case of the electrical fault, a potential difference may be generated in any two of the neutral line of the electrical equipment, the first neutral point of the power side detection/recovery unit, and the second neutral point of the load side detection/recovery unit, a current may be generated by connecting any two of the neutral line, the first neutral point, and the second neutral point, or a current flowing in the power line connected between the electrical equipment and the load side detection/recovery unit or the power line connected between the power side detection/recovery unit and the load side detection/recovery unit may be generated as unbalanced current so that the fault detector may perform at least one of detection, interruption, alarming, and recovery.

In the above, when the electrical fault occurs in the electrical equipment, the power line, the neutral line, or the power side detection/recovery unit, a magnitude of a fault supplementary power (voltage, current) generated in the neutral point of the detection/recovery unit may differ according to a kind of the electrical fault, a fault state, a degree of the fault, and a capacity of a load.

In the above, the detection/recovery unit may be provided in each of power lines to which the electrical equipment is connected, provided by section, provided by place, or provided to be linked by the electrical equipment, so that detection or recovery range may be limited based on a section and place where the detection/recovery unit is provided and an installation location or the electrical fault from a location where the detection/recovery unit is installed to the main voltage transformer provided at the electrical equipment may be detected or recovered.

In the above, in case of an electrical fault due to an increase in resistance, an arc, a disconnection, or an open phase occurs in an R phase, an S phase, or a T phase or a neutral line N in power flowing into the power line from the electrical equipment (e.g., a power distribution system, a transformer, an uninterruptible power supply system (UPS), an emergency power equipment (generator, charger, etc.), a switchboard, a control panel, a distribution panel, a molded case circuit breaker (MCCB), a circuit breaker, an outlet, an electric line, etc.) or a power side detection/recovery unit due to lightning, a short circuit, a ground fault, equipment burning damage, or fuse break in the electrical equipment or in the power side detection/recovery unit, the load side detection/recovery unit may perform detection or recovery and supply normal power to the load.

In the above, the power side or load side detection/recovery unit may be provided in parallel on the power line regardless of capacity of the load, supply power to the electrical equipment without interruption regardless of a fault of the detection/recovery unit, and may perform detection, alarming, interruption, and control in the event of a self-fault due to a coil disconnection, an increase in resistance, occurrence of an arc, incorrect wire connection, occurrence of an abnormal voltage, an electric leakage, and insulation deterioration.

In the above, the detection/recovery unit electrically and electronically connected in parallel to a power line and a neutral line connecting a single-phase or three-phase power supply and a load may be configured by connecting the first neutral point of the power side detection/recovery unit and the second neutral point of the load side by an inductor or an electronic element regardless of capacity of the load, and in case of the electrical fault, the electrical fault may be immediately interrupted by generating a voltage or a current from the first neutral point and the second neutral point and by generating a voltage or a current from the neutral point or the neutral line or may be detected through a fault detector.

In the above, the electronic element may be a resistor, a capacitor, a varistor, silicon, germanium, carbon, a coil, an integrated circuit, a relay, a solid state relay (SSR), or a trip coil.

In the above, the fault detector may detect voltages of any two of a first neutral point, a second neutral point, a neutral line, and the earth or detect a current by connecting the any two of the first neutral point, the second neutral point, the neutral line, and the earth to detect an electrical signal generated in case of the electrical fault, and when the occurrence of the electrical fault is detected, the fault detector may perform an alarm through an alarm generator, interrupt through a circuit breaker, control through a controller, or recover to a normal power through the power side detection/recovery unit or the load side detection/recovery unit.

In the above, the fault detector may be at least one of an electronic relay (SSR), a zero current transformer (ZCT), a voltage detector, a current detector, a relay, a trip coil, and an electric leakage breaker (ELB) to detect a fault occurrence electrical signal output from the neutral point or the power line.

In the above, the electric circuit may be configured and connected by dividing the detection/recovery unit according to a capacity, function, installation location, and installation quantity of the electrical equipment connected to the power line, a current in a divided section may be detected to prevent malfunction during a normal operation, and in case of the electrical fault, the detection/recovery unit may be connected to a place where a faulty section, a fault place, and a fault location of the electrical equipment are to be recognized, and generate an electrical signal from a neutral point so that a fault electrical equipment is specified.

In the above, the power side detection/recovery unit may be connected to the three-phase four-wire type electrical equipment to supply power by removing a neutral line at the time of supplying single-phase power to interrupt zero harmonic and noise flowing into the electrical equipment at the neutral line by a non-linear single-phase load, prevent inflow of an unbalanced overvoltage when the power side neutral line is disconnected, resolve three-phase unbalance due to a single-phase load by using power of three phases together when supplying single-phase power, thereby preventing malfunction of the system and burning damage, overheating, and a fire of the electrical equipment.

In the above, the "power distribution system for detecting and repairing all electrical faults" may include:

a power side detection/recovery unit having a first neutral point and connecting the neutral point to a neutral line provided in the electrical equipment or connecting the neutral point to a second neutral point of the load side detection/recovery unit; the load side detection/recovery unit having a second neutral point and connecting the neutral point to a first neutral point of the power side detection/recovery unit or a neutral line provided in the electrical equipment to interrupt, detect, or recover an electrical fault on the power side, wherein the load side detection/recovery unit is provided to be linked according to an installation location of the electrical equipment or at least load side detection/recovery unit is provided for each floor or each electrical equipment to distinguish a section, a place, and a circuit location in case of a fault; a fault detector separately detecting input/output currents of a power line or a neutral point distinguished in the section, the place, and the location, separately detecting a voltage or a current of the neutral point and the neutral line or the neutral point and the neutral point and performing alarming or breaking, or transferring a detected fault detection value including a self-location to a controller; a controller comparing the detection value provided from the fault detector with a preset value and performing alarming, interruption, recovery, notification, monitoring, or control corresponding to a fault location or performing control in association with an RTU communication module when a fault is determined; an alarm generator generating an alarm according to an alarm signal provided from the fault detector or the controller; an alarm release input unit releasing alarm issuance of the alarm generator; and a circuit breaker interrupting fault power according to an interrupt signal from the fault detector or the controller.

According to another aspect of the present disclosure, there is provided a "construction method for a power distribution system for detecting and repairing all electrical faults" including:

a step in which a power side detection/recovery unit connected in parallel to a power side of a power line provided in a plurality of electrical equipment configures a first neutral point, a load side detection/recovery unit connected to a load side of the power line configures a second neutral point, and at least two of the detection/recovery units are installed to be linked to the electrical equipment according to an installation place, an installation section, a circuit location, and an equipment function; a step in which the first neutral point of the power side detection/recovery unit is connected to the second neutral point of the load side detection/recovery unit, the first neutral point of the power side detection/recovery unit is connected to a neutral line of the electrical equipment, or the neutral line of the electrical equipment is connected to the second neutral point of the load side detection/recovery unit, and in case of the electrical fault, the detection/recovery unit generates a voltage or a current from the neutral point, and in order to interrupt or detect an electrical fault between any two of the electrical equipments, the power side detection/recovery unit, and the load side detection/recovery unit to which the power line or the neutral point is connected, a detection/recovery power distribution system is configured by installing an electric leakage breaker (ELB) or a fault detector at the power line; and a step in which when the fault detector in the detection/recovery power distribution system detects the electrical fault that occurs in the electrical equipment connected to each other by a power line and a neutral line, in the detection/recovery unit, or in the power line or the neutral line and informs a controller about a faulty section, a fault place, and a fault location, the controller is installed to perform at least one of recovery, interruption, alarming, notification, and control by performing comparing and determining with a preset value.

Advantageous Effects

According to the present disclosure, in case of an electrical fault of a power line that receives power from a main voltage transformer, a switchboard, an uninterruptible power supply system (UPS), emergency power equipment (generator, etc.), a distribution panel, a control panel, an outlet, and the like, which is a single-phase two-wire type or three-phase three-wire type or three-phase four-wire type electrical equipment, immediate interruption, location detection, recovery to normal power, and alarming may be performed according to installation section, place, and position of the faulty electrical equipment, whereby occurrence of various accidents due to the electrical fault may be prevented and repairing may be performed immediately without having to find out and check a fault place. This may prevent the occurrence of a mortality event such as an electric shock due to a malfunction of an electrical equipment, burning damage of device, device paralysis, electric fire, and the like due to an electrical fault due to an increase in resistance, arc, open phase, disconnection, loose contact, short circuit, partial wire disconnection, unbalance, etc.

In addition, electrical equipment itself supplied with power from the electrical equipment or the system itself provides a notification (alarm) about an electrical fault due to electric leakage, disconnection, an increase in resistance, an arc, an open phase, loose contact, partial wire disconnection, unbalance, etc., or performs control, thereby rapidly repairing the electrical fault to prevent spread of an accident.

In addition, each electrical equipment is separately detected such that normal currents flowing in a plurality of electrical equipments supplied with power from the power system are prevented from gathering to cause malfunction, whereby a malfunction of fault detection may be prevented by dispersing detection currents, and a fault position of electrical equipments located at different places may be immediately checked to promptly cope with the fault, thereby configuring a safe power distribution system capable of preventing electrical equipment from being paralyzed due to the electrical fault or the occurrence of an electric shock and a fire accident.

In addition, the power side and load side detection/recovery units may be configured to be connected in parallel to a power line, regardless of capacity of the electrical equipment and the load, to detect an electrical fault, and even when the electrical fault is recovered, only an important load may be recovered according to capacity of the important load, regardless of total capacity of a plurality of loads, thereby reducing the cost of the product and the installation area. In addition, since power is supplied by connecting a power line supplied from a power system to the electrical equipment or the load in series, power may be stably supplied to the electrical equipment or the load even in case of a fault of the detection/recovery unit.

In addition, when supplying single-phase power in a three-phase four-wire system, it is possible to supply power to the load using the current of the R, S, T (three) phases together, so that a potential difference of the single-phase power may be stepped down and supplied, while phase unbalance does not occur on the power side, and power may be supplied to the load by preventing an occurrence of a ground potential of the single-phase power, and in case of an electrical fault, faulty electricity may be detected, be interrupted, be recovered, trigger an alarm, provide a notification, and be controlled.

DESCRIPTION OF DRAWINGS

FIG. 8 is a table of calculating supplementary current recovered and supplied when resistance in one line increases in a power line.

BEST MODES

A "power distribution system for detecting and repairing all electrical faults" according to the present disclosure may include: a power side detection/recovery unit having a first neutral point and connecting the neutral point to a neutral line N connected to an electrical equipment or to a second neutral point of a load side detection/recovery unit; a fault detector having a second neutral point, connecting the neutral point to the neutral line N connected to the electrical equipment or to the first neutral point of the power side detection/recovery unit, having at least one load side detection/recovery unit generating fault supplementary power by detecting a power side electrical fault in real time in a linked manner according to an installation location, installation place, and installation section of the electrical equipment, detecting a current between the power side detection/recovery unit and the load side detection/recovery unit or between a power line or a neutral point to which the electrical equipment and the load side detection/recovery unit are connected or detecting a voltage the neutral point and the neutral point or neutral point and the neutral line, performing an alarm or breaking or transferring a fault detection value and self-location to a controller; a controller comparing the detection value provided from the fault detector with a reference set value, issuing an alarm, interrupting power, displaying a faulty section and location, or transferring a fault situation to a communication module so as to provide a notification wiredly or wirelessly when a fault is determined, and releasing the alarm when an alarm release signal is received; an alarm generator generating an alarm according to an alarm signal provided from the fault detector or the controller; an alarm release input unit releasing alarm issuance of the alarm generator; and a circuit breaker interrupting fault power according to an interrupt signal from the detection/recovery unit, the fault detector, or the controller.

Figure 2:
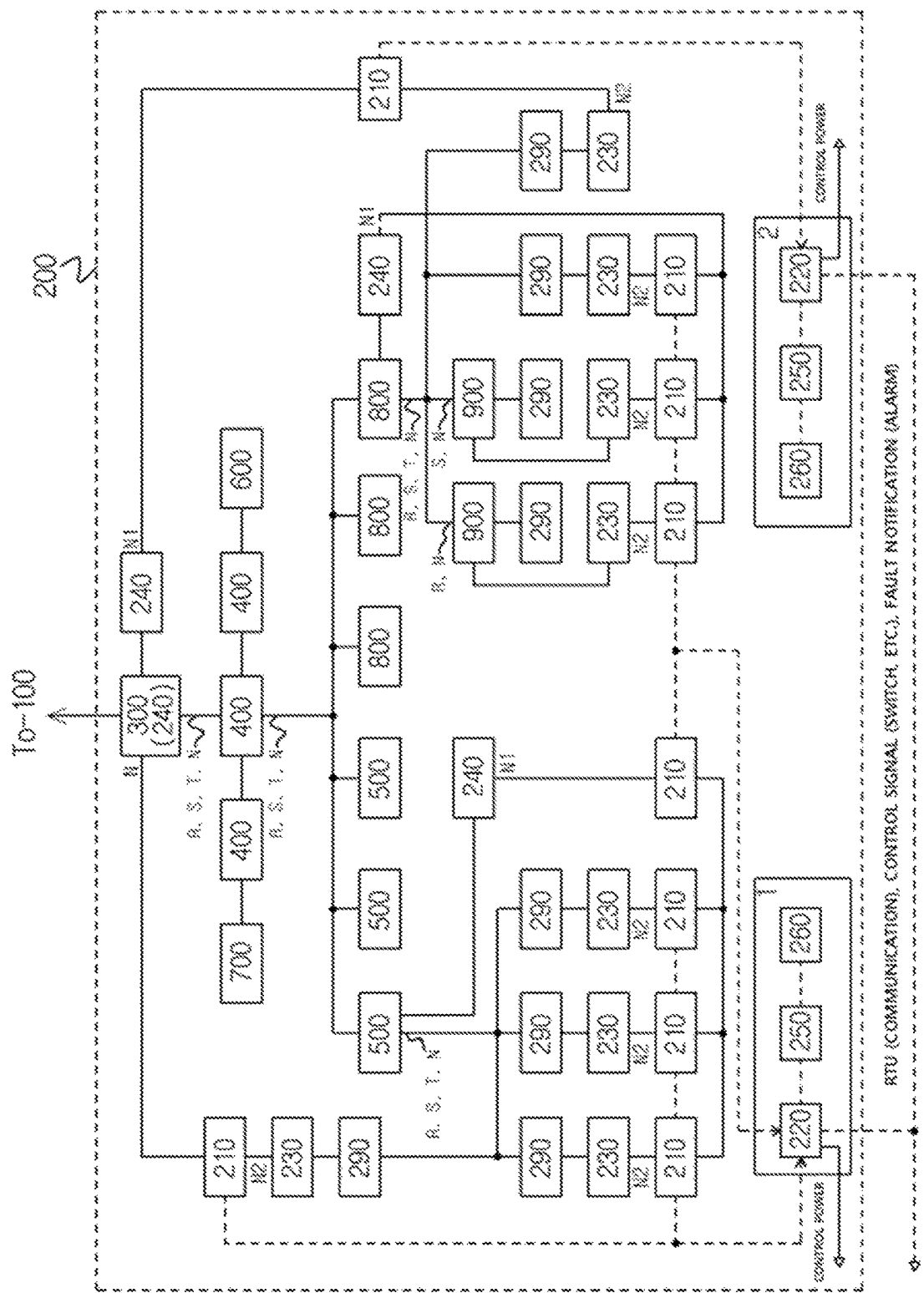
FIG. 2 is a configuration diagram of a power distribution system 200 for detecting and repairing all electrical faults.

FIG. 2 is a block diagram of a power distribution system 200 according to an embodiment of the present disclosure, which includes the following components.

Figure 1:
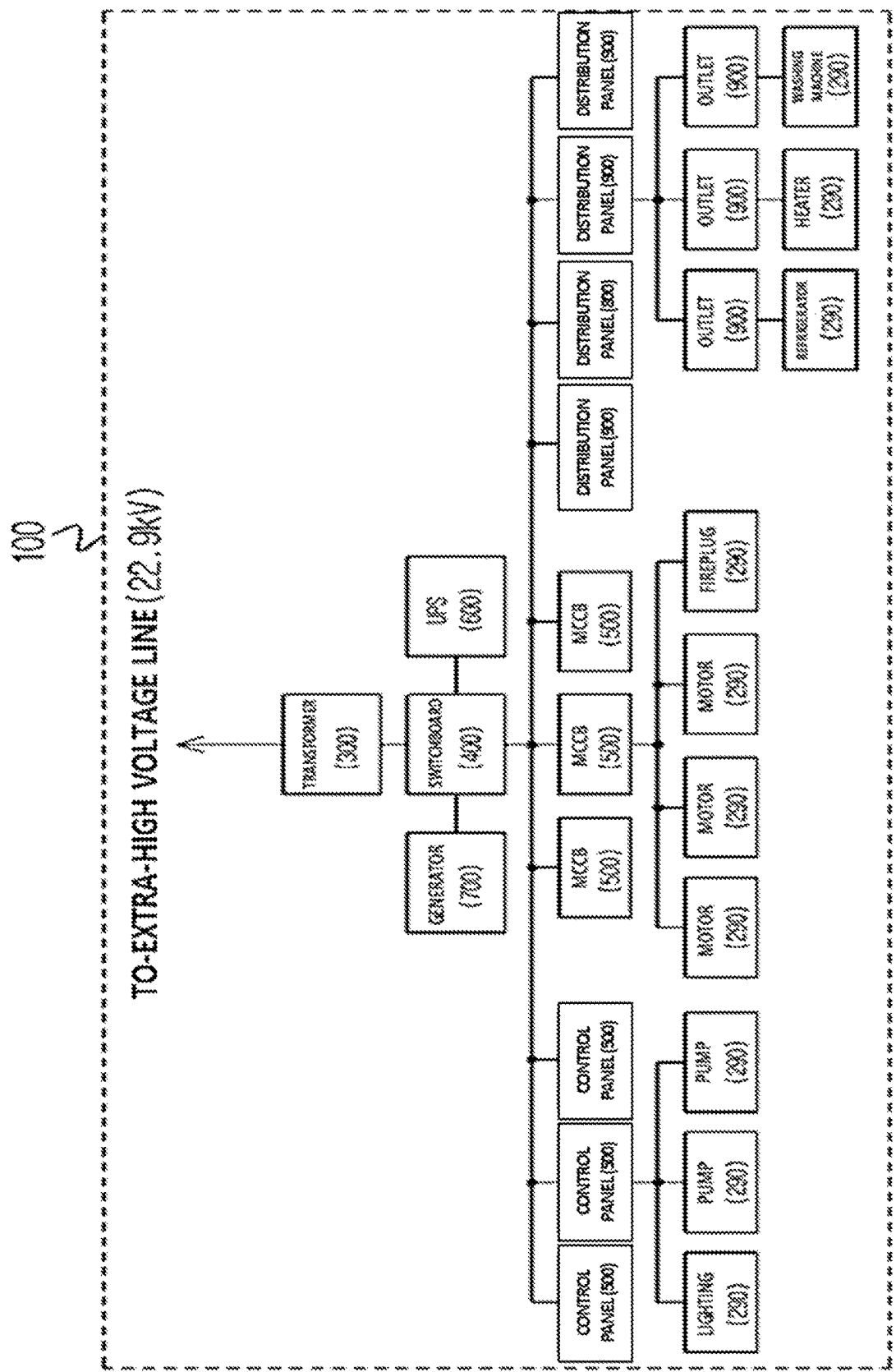
FIG. 1 is an exemplary configuration diagram of an electrical equipment connected to a power distribution system as an existing electrical equipment.

A power side detection/recovery unit 240 connected in parallel to power lines of electrical equipment (300, 400, 500, 600, 700, and 800 of FIGS. 1 and 2) provided in a power distribution system (e.g., 100 of FIG. 1 or 2) which is an existing single-phase or multi-phase multi-wire type (e.g., single-phase two-wire type, single-phase three-wire type, three-phase three-wire type, three-phase four wire-type, etc.) electrical equipment. The power side detection/recovery unit 240 includes a neutral point (first neutral point) by itself. By connecting the neutral point to a neutral line N of the electrical equipment or to a second neutral point N2 of a load side detection/recovery unit 230, the power side detection/recovery unit 240 serves to perform breaking, detection, or recovery in case of an electrical fault at a power line (e.g., power supply line, bus duct, etc.).

In addition, a load side detection/recovery unit 230 connected in parallel to a power line of a load side electrical equipment (e.g., 290 and 900 in FIG. 2). The load side detection/recovery unit 230 includes another neutral point (second neutral point) by itself. By connecting a second neutral point N2 to a power side electrical equipment or to the first neutral point N1 of the power side detection/recovery unit 240, the load side detection/recovery unit 230 immediately cuts off power using an existing electric leakage breaker (ELB) 270 in case of an electrical fault in a power line or performs breaking, alarming, notification, recovery, control, and the like by detecting the electrical fault. Here, the electrical fault refers to an increase in resistance, an arc, a disconnection, an open phase, unbalanced power, a connection failure, an incorrect wire connection, electric leakage, a short circuit, and the like that occurs in an electrical equipment (transformer, generator, uninterruptible power supply system (UPS), switchboard, distribution panel, control panel, switch, circuit breaker, electric line, switch, fuse, terminal, outlet, bus duct, etc.) configured in the power distribution system or the power distribution system itself.

A fault detector 210 that detects the occurrence of an electrical fault of the power side by interworking with the load side detection/recovery unit 230. The fault detector 210 detects a current of a main power line (R, S, T or R, N, etc.) connected in parallel with the load side detection/recovery unit 230, detects a current value of the neutral line N connected to the second neutral point N2 of the load side detection/recovery unit 230 or the first neutral point N1 connected to the second neutral point N2, or detects voltages from any two of the first neutral point N1, the second neutral point N2, the neutral line N, and the earth E, immediately performs breaking, recovery, alarming or notifying about the fault, or includes location information of the fault detector 210 in a detected fault detection value and transfers the fault detection value to a controller 220.

An alarm generator 250 for alarming a fault occurrence and faulty section, place, and fault location detected by the fault detector 210 or determined by the controller 220 described below as a visual and/or audible alarm.

An alarm release input unit 260 that generates an alarm release signal upon receiving a signal for releasing the generated alarm (for example, when an alarm release switch is operated).

A circuit breaker 270 that interrupts the power line and the neutral line of the power side and the load side of the power distribution system according to the detection of the occurrence of the fault by the fault detector 210 or according to an interrupt signal of the controller 220 described below.

The controller 220 that determines an electrical fault of an electrical equipment upon receiving a fault detection value including a faulty section, a fault place, and a fault location from an output of the fault detector 210, and immediately recovers the faulty section, the fault place, and the fault location, or outputs an alarm or an interrupt signal for operating the alarm generator 250 or the circuit breaker 270, notifies an external manager of a fault situation wiredly or wirelessly using a communication module, detects (monitors) a fault situation through bi-directional communication, and is controlled by the manager.

Figure 3:
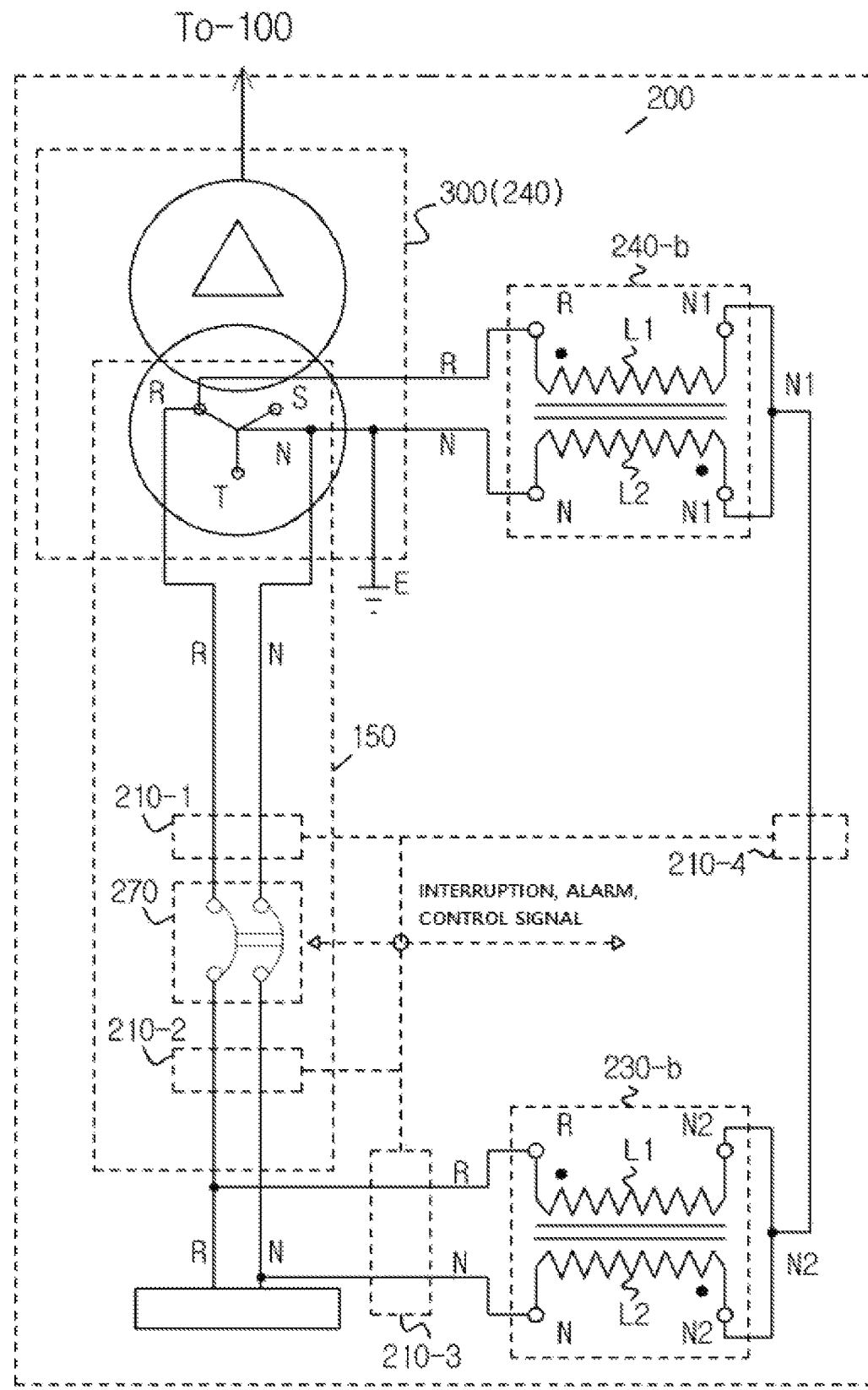
FIG. 3 is a circuit diagram of the embodiment of FIG. 2 in the case of a single-phase two-wire type power supply.
Figure 4:
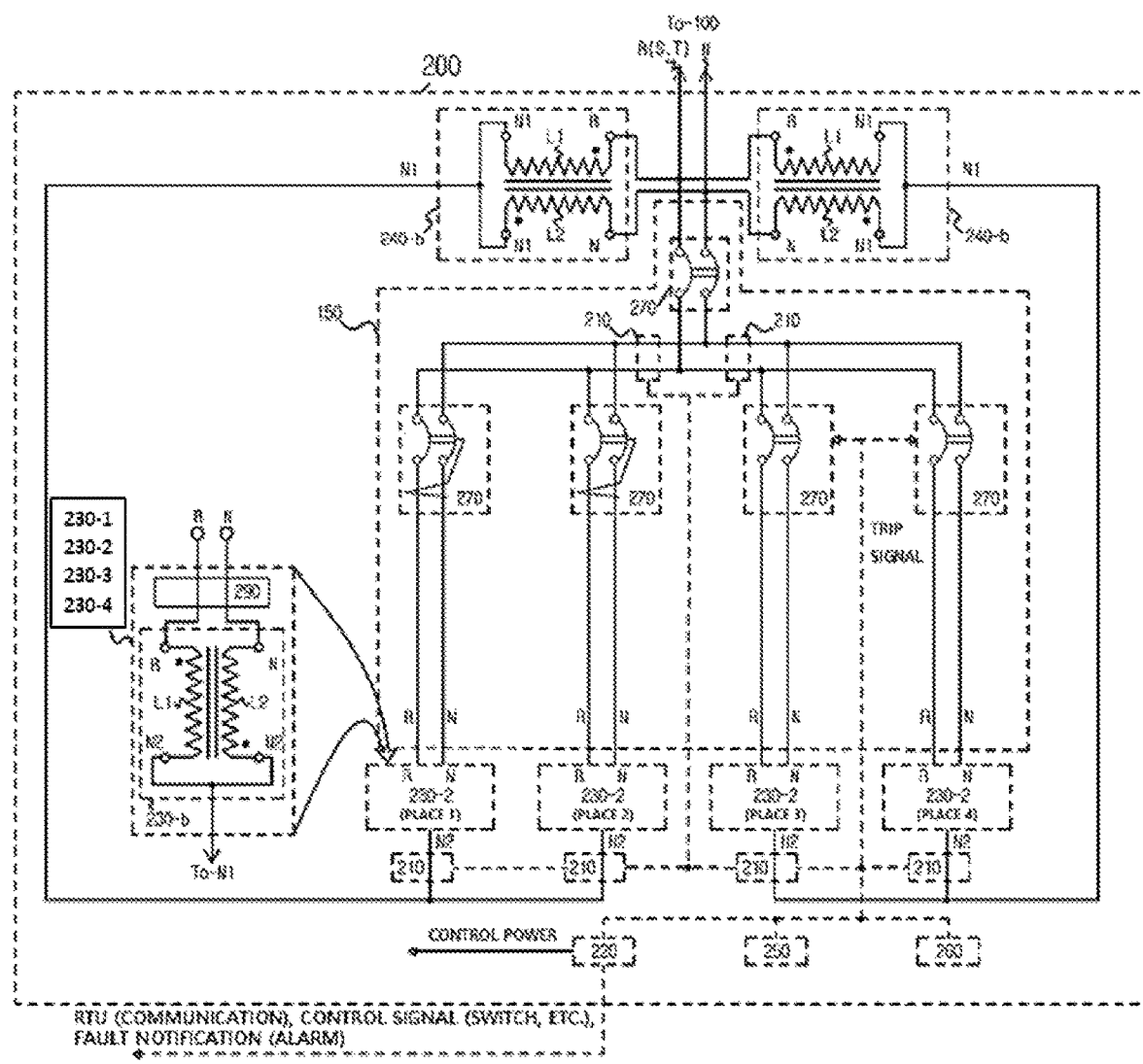
FIG. 4 is a circuit diagram of the embodiment of FIG. 2 in the case of configuring a plurality of load circuits as a modification of FIG. 3.
Figure 5:
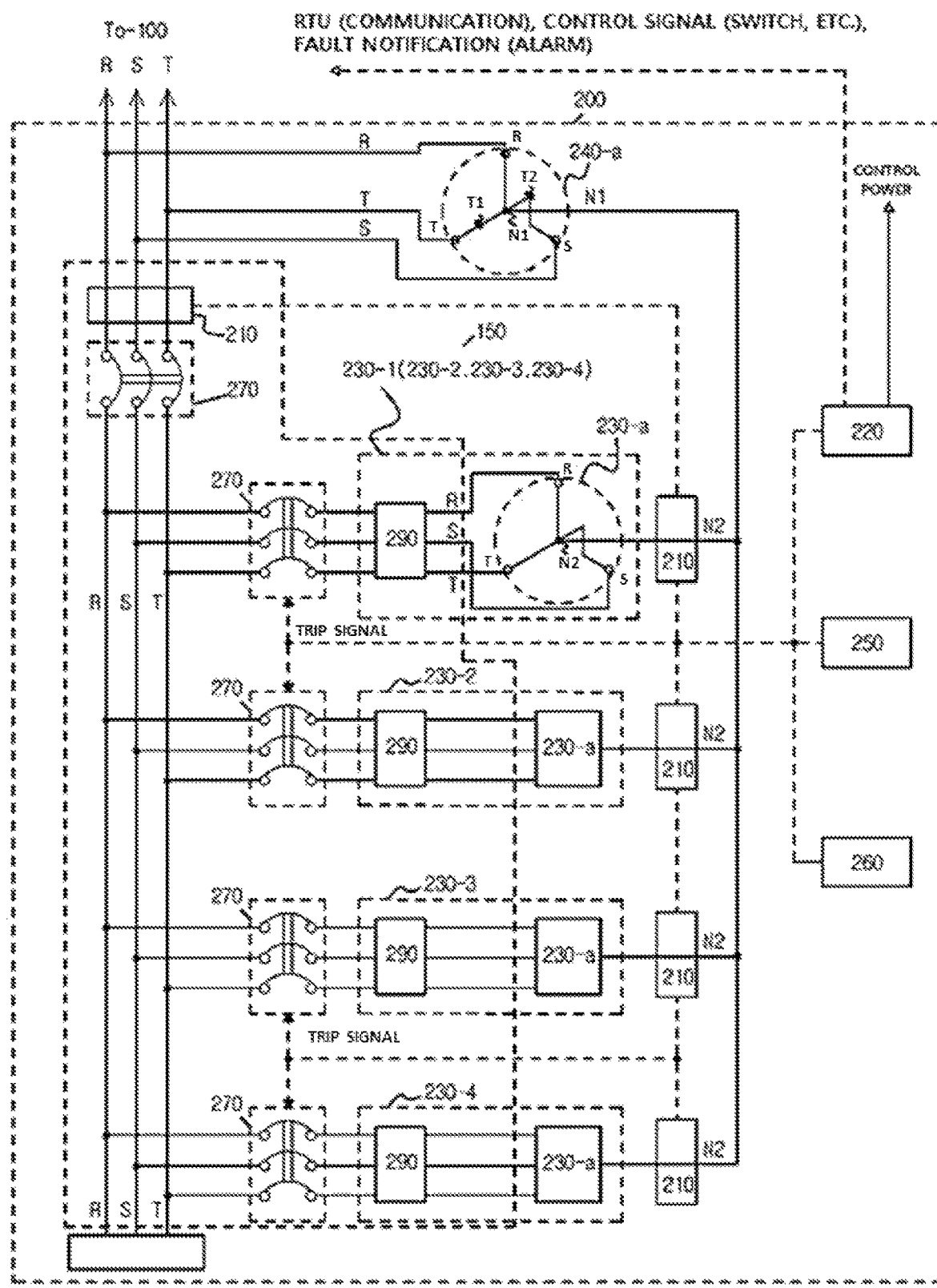
FIG. 5 is a circuit diagram of the embodiment of FIG. 2 in a case where a three-phase three-wire type power supply is provided and a plurality of load circuits are configured according to places.
Figure 6:
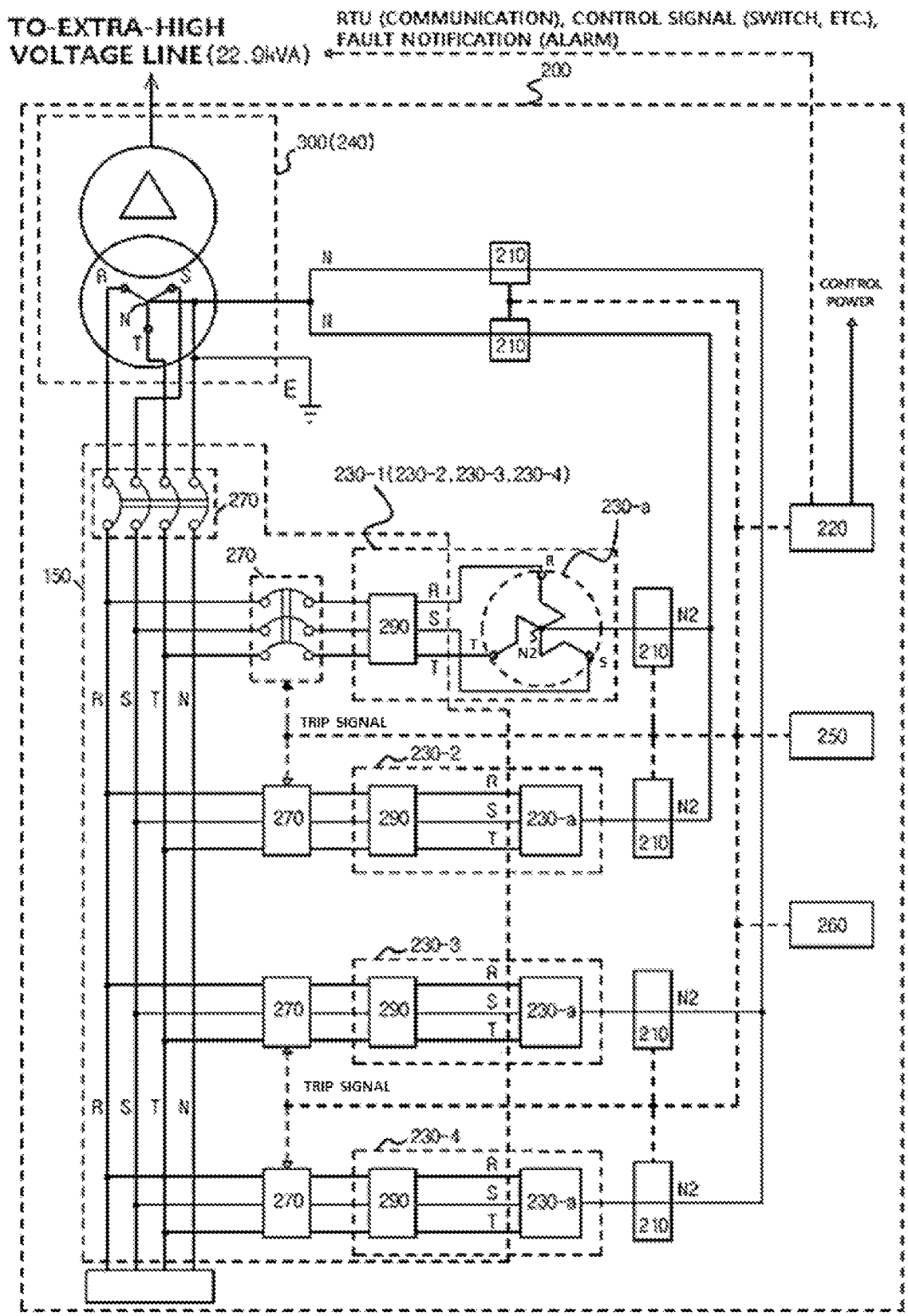
FIG. 6 is a circuit diagram of the embodiment of FIG. 2 in a case where three-phase four-wire type power supply is provided and a plurality of load circuits are configured according to places and current splitting.
Figure 7:
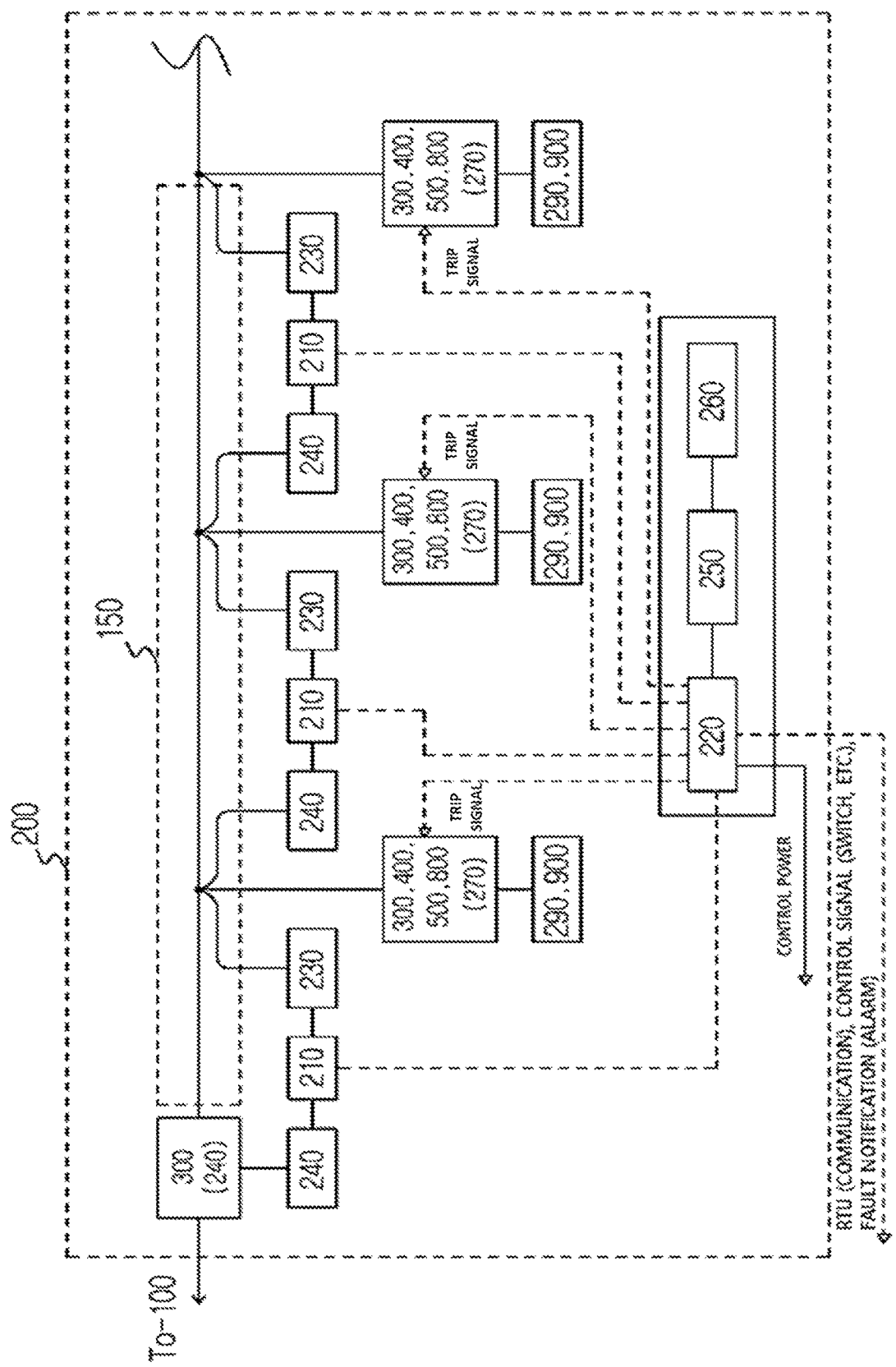
FIG. 7 is a circuit diagram of the embodiment of FIG. 2 in the case of configuring according to a section of a single-phase or three-phase electric line.

Hereinafter, details of each component of FIG. 2 will be described through specific embodiments with reference to FIGS. 3 to 7. FIG. 3 is a circuit diagram of an embodiment of a power distribution system 200, which is the embodiment of FIG. 2 in the case of a single-phase two-wire type incoming power supply. FIG. 4 is a circuit diagram of the embodiment of FIG. 2 when a line of a detection/recovery power distribution system 150 includes a plurality of circuits according to an installation location of an electrical equipment in a modification of FIG. 3, which is a single-phase two-wire system, FIG. 5 is a circuit diagram of the embodiment of FIG. 2 when a plurality of circuits are configured according to an installation location of an electrical equipment in the case of a three-phase incoming power supply, FIG. 6 is a circuit diagram of the embodiment of FIG. 2 when a plurality of circuits are configured according to an installation location of an electrical equipment in the case of a three-phase four-wire type incoming power supply, and FIG. 7 is a configuration circuit diagram of the embodiment of FIG. 2 in the case of configuring a circuit for detecting/recovering a faulty section according to an installation section of an electric line (bus duct, etc.).

In order to receive power from a main voltage transformer (e.g., 300 of FIGS. 1 and 2) of a power distribution system (e.g., 100 of FIG. 1), a switchboard (e.g., FIG. 2 of 400), a control panel (e.g., 500 of FIG. 2), a UPS (e.g., 600 of FIG. 2), a generator (e.g., 700 of FIG. 2), a distribution panel (e.g., 800 of FIG. 2), etc., which is an electrical equipment, the power side detection/recovery unit 240 is connected in parallel to a power line (bus duct, etc.) of the electrical equipment, configures a first neutral point N1 by itself and connects the first neutral point N1 to a second neutral point of a load side detection/recovery unit in the case of a single-phase two-wire type (e.g., FIG. 3) and three-phase three-wire type (e.g., FIG. 5), and when the load side detection/recovery unit 230 detects, interrupts, and performs a notification about the electrical fault, the power side detection/recovery unit 240 is configured with a minimum capacity for fault detection to reduce loss of transformer, production cost, installation area, and construction cost (in the case of detection, fault supplementary current increases as a load capacity increases as shown in FIG. 8, and thus it is sufficient to detect a fault (more than 15 mA) even if the capacity of the detection/recovery unit is reduced to a minimum level (about 5 VA).

As a specific example, a single-phase power side detection/recovery unit 240-b in FIG. 3 includes coils L1 and L2 connected in parallel to an R (S, T) phase of an electrical equipment 300 (there is 400, 500, 600, 700, and 800 therebetween) provided in the power distribution system 100 and an N line single-phase power line and a first neutral point N1 connected to a second neutral point N2 of a load side detection/recovery unit 230-b. The first neutral point N1 is provided between both ends of two coils L1 and L2 connected in series. The coils L1 and L2 may be actually one coil and a tab provided therebetween may be used as the first neutral point N1. In the power side detection/recovery unit 240-b of the embodiment of FIG. 3, both ends (one end and the other end) of the coils L1 and L2 are connected in parallel to a power side power line R, N. S, N.T, N supplied from the power distribution system 100 to the electrical equipment, one neutral point (first neutral point) may be formed between one end and the other end of the coils L1 and L2, and a detection/recovery power distribution system 150 for detecting or recovering an electrical fault is configured by connecting the one neutral point to the second neutral point N2 of the load side detection/recovery unit.

In addition, in FIG. 4, the power side and the load side detection/recovery units 240-b and 230-b include coils L1 and L2 connected in parallel to single-phase power of power line R phase and N line provided in the electrical equipment which is a power distribution system 100 and neutral points N1 and N2, and a first neutral point N1 of the power side detection/recovery unit 240-b and a plurality of second neutral points N2 of the load side detection/recovery unit 230-b configured according to sections, places, and locations of a plurality of electrical equipments are connected in series or in parallel. Accordingly, the plurality of load side detection/recovery units 230 detect occurrence of an electrical fault of an electrical equipment and interrupt a faulty section, a fault place, and an installation location of the faulty electrical equipment or provides a notification about and transfers the occurrence of the electrical fault so that recovery, interruption, alarming, notification, and control may be performed on the faulty section, fault place, and installation location.

In addition, in a three-phase three-wire type lead-in power embodiment of FIG. 5, a power side detection/recovery unit 240-a includes coils P1, P2, and P3 connected to power lines R, S, and T, and a neutral point of the coils P1, P2, and P3 is made to configure a first neutral point N1, and the neutral point is generated and provided to play a role similar to that of a neutral line. A configuration of a load side detection/recovery unit 230-a is the same as the power side detection/recovery unit 240-a but a neutral point of the load side detection/recovery unit 230-a is provided as a second neutral point N2, and the first neutral point N1 and the second neutral point N2 are connected in series with each other to generate a corresponding fault supplementary power in case of an electrical fault of the power lines R, S, and T (depending on a field, a load side detection/recovery unit 230-d that outputs power through all three phases based on the neutral point may be used to improve unbalance and cancel high frequency (noise)).

Figure 12:
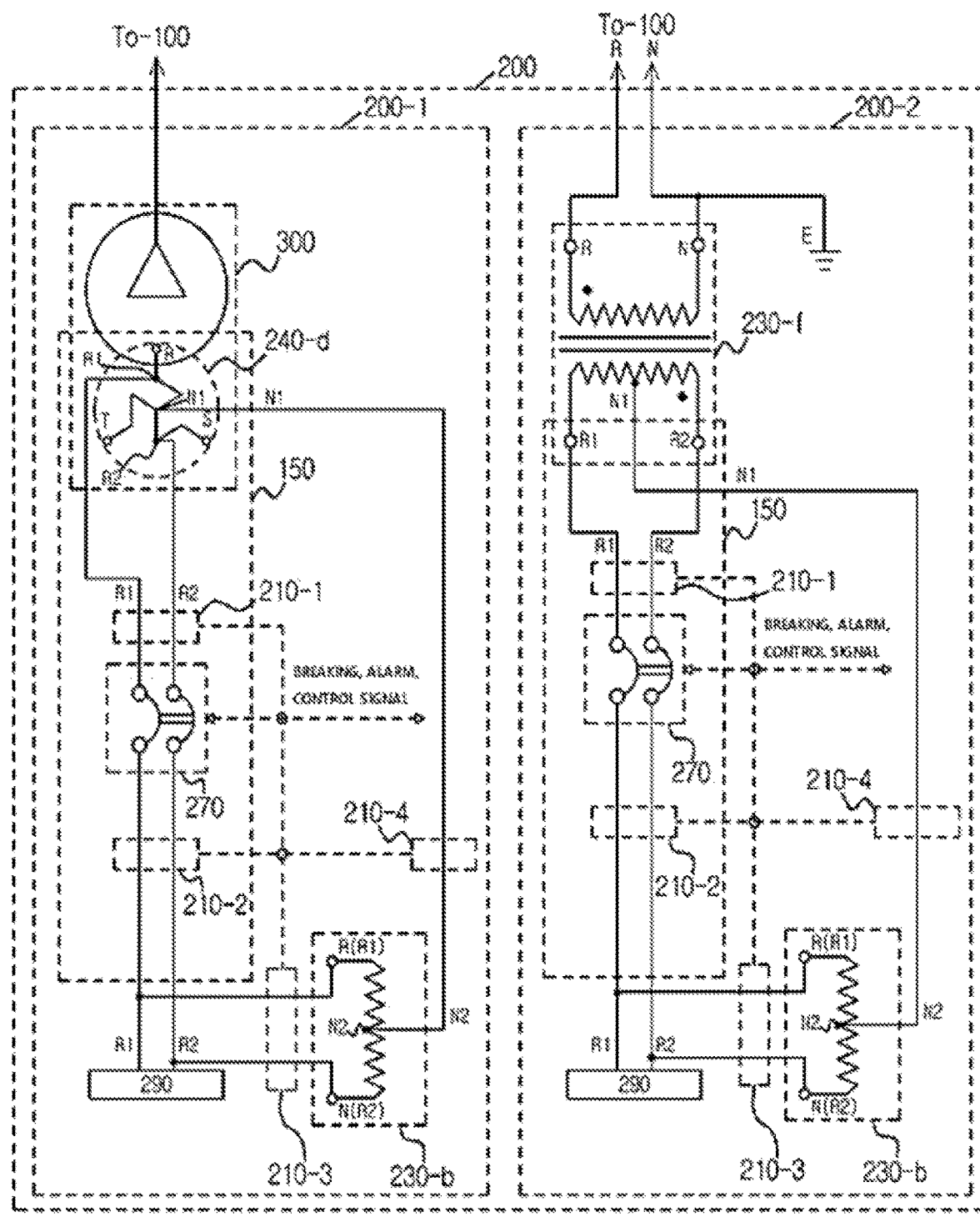
FIG. 12 is a circuit diagram of an embodiment in which a power side detector/recover device is configured as an insulating transformer not to generate an earth voltage in single-phase power supply lines R1 and R2 and an electrical fault detection and recovery is made possible on a load side.
Figure 13:
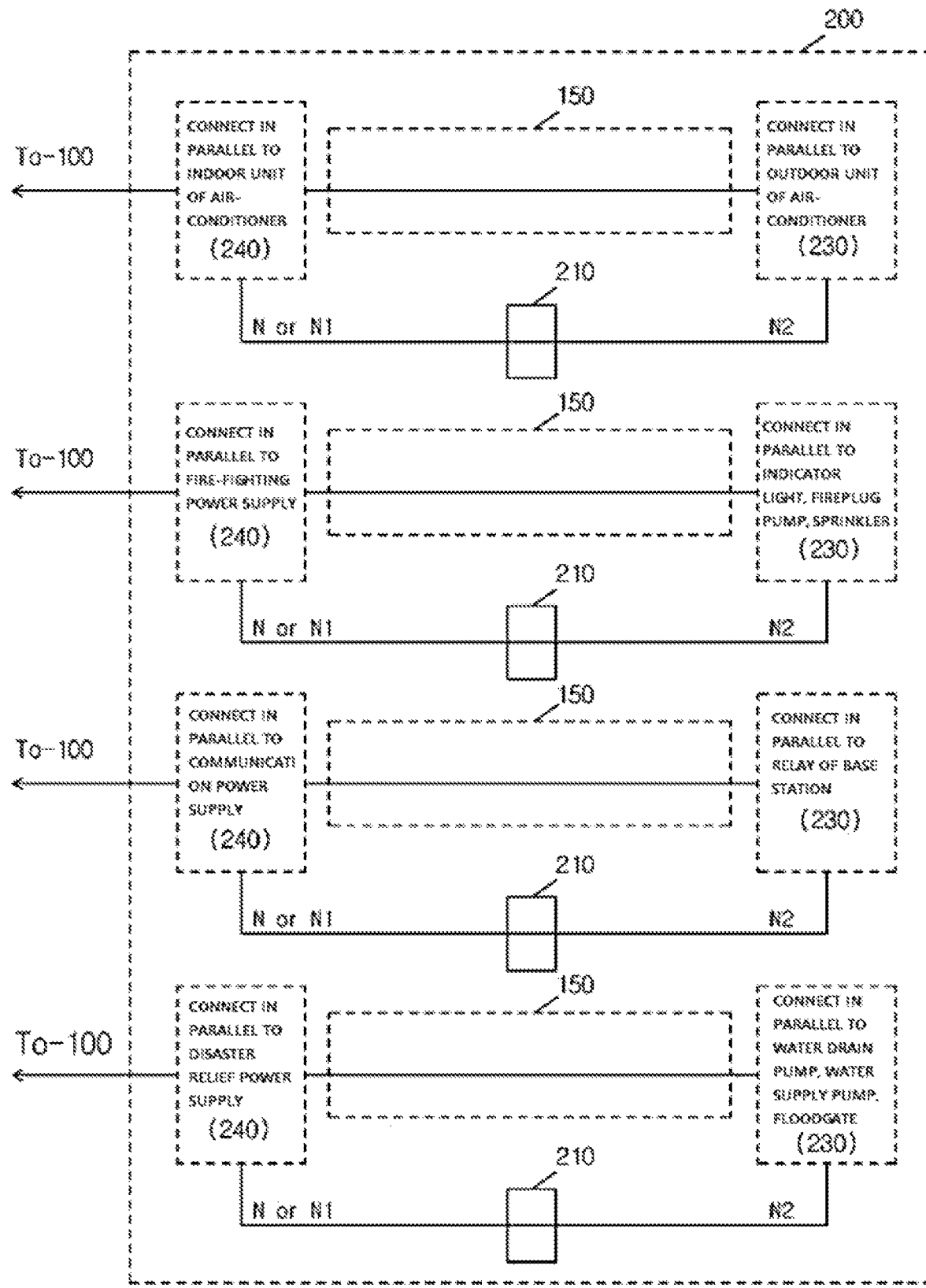
FIG. 13 is a configuration diagram of various embodiments that may be implemented according to types of load.

Meanwhile, in the case of a three-phase four-wire lead-in power, the load side detection/recovery unit 230-a may be configured to directly connect the power side detection/recovery unit 240-a connected to a power line and a neutral line of the power system 100 to a main voltage transformer 300, excluding electrical equipments 400, 500, 600, 700, and 800, as shown in FIG. 6 so that, in the case of a three-phase load, a second neutral point N2 is connected to a neutral line N, and when connected to a single-phase load in a three-phase four-wire system, single-power power supply lines R1 and R2 are supplied to the single-phase load using a three-phase current as shown in 200-1 of FIG. 12 and connected to a load side detection/recovery unit 230-b to configure a detection/recovery power distribution system 150.

Comprehensively explaining the power side detection/recovery unit 240 in detail, if a single-phase power voltage of the existing three-phase four-wire (R, S, T, N) or single-phase (R-N, S-N, T-N) power distribution system is 220 V, a potential difference with the ground is 220 V. Here, a power side detection/recovery unit 240-b receives power of single-phase (R, N, etc.) 220 V in parallel. The load is supplied with single-phase power by connecting a power line, regardless of output capacity of the power side detection/recovery unit 240-b. As a result, the load is supplied with single-phase power regardless of the capacity of the power side detection/recovery unit 240-b and self-fault, and a tab or a first neutral point N1 is configured between windings at both ends of the coils L1 and L2 supplied with power from the power side detection/recovery unit 240-b, and the neutral point N1 is preferably configured and connected to the second neutral point N2 of the load side detection/recovery unit 230-b not to cause a potential difference therebetween in a normal state.

Such a power side detection/recovery unit 240-b is connected in parallel to a power line in which a single-phase supply power is connected to a load, and in case of self-fault or an electrical fault such as disconnection, an increase in resistance, and the like, of the power line connected to the load or the power side detection/recovery unit 240-b, a potential difference occurs between the neutral points N1 and N2 and voltage and current flow, and this may be detected in real time to perform interruption, alarming, or recovery to fundamentally prevent an electric accident due to the electrical fault through the detection/recovery units 240-b and 230-b.

Next, the load side detection/recovery unit 230-b connected to the load side will be described.

In FIG. 3, the load side detection/recovery unit 230-b is configured such that the second neutral point N2 is formed at a connection point (or a tab configured between both ends of one coil L1-L2 connected to two lines) of coils L1 and L2 which are connected in parallel to 2 lines R' and N' (power lines) supplied to a load and which single-phase power is input to or output from, so that a potential difference is not made at the first neutral point N1 of the power side detection/recovery unit 240-b in a normal state.

The configuration of the load side detection/recovery unit 230-b of FIG. 4 is similar to the load side detection/recovery unit 230-b of FIG. 3, but a plurality of load side detection/recovery units 230-1, 230-2, 230-3, and 230-4 configure a circuit associatively for each load (e.g., electric device, home appliance, etc.) to configure a circuit breaker 270 in each circuit, a neutral point is detected to inform about a location of a fault circuit, and the load side detection/recovery unit 230-b connects to perform interruption, alarming, notification, recovery maintaining, and the like, according to a control signal immediately after recovery. In addition, in FIG. 4, one or more load side detection/recovery units 230-b are connected in parallel to the main circuit (power side detection/recovery unit, circuit breaker, power line, etc.) to perform a kind of redundancy function.

Next, the fault detector 210 detects a current flowing in the power line to which the load side detection/recovery unit 230-b is connected using a current/voltage detector or detects a current or a voltage between a first neutral point and a second neutral point N2 or between a neutral line and a second neutral point. In this case, if voltage detection is to be performed by a trip coil in case of electrical fault, the circuit breaker is tripped immediately when voltage occurs as a fault, or if current detection of the power line is to be performed by an earth leakage breaker in case of a fault, power is cut off almost simultaneously (within 0.03 seconds) with the occurrence of the electrical fault. The controller (220 in FIG. 2) compares a fault detection value including a location place and a location of a faulty section detected by the plurality of fault detectors 210 with a value previously set in the controller 220 to determine a fault location and whether a fault has occurred. If the fault is determined, the controller 220 outputs a trip signal to the circuit breaker 270 or provides a notification about a fault location. The trip signal may be designed to be output from the fault detector 210 as shown in FIG. 3 or may be designed to be output from the controller 220 of FIG. 4.

Meanwhile, as another embodiment, if the fault detector 210 is implemented as a solid state relay (SSR), a zero current transformer, etc., disconnection of the power line is detected, based on which alarming or interruption may be performed or the controller 220 may determine the disconnection and perform control according to a set value.

Now, the operation of the power distribution system 200 using the single-phase power shown in FIGS. 3 to 4 will be described in detail.

The power side detection/recovery unit 240-b includes a coil and an iron core which are inductance outputting a first neutral point between single-phase powers by connecting the single-phase powers (R,N.S,N.T,N) supplied to a load in parallel on a power side power line (bus duct, etc.). The first neutral point N1 is formed between both ends of the winding of the coil, and in order to connect the neutral point N1 to the second neutral point N2, neutral points of the power side detection/recovery unit 240-b and the load side detection/recovery unit 230-b are configured by winding to have the same voltage ratio, and the first neutral point N1 and the second neutral point N2 are connected at an equal potential, whereby there is no potential difference between the first neutral point N1 output and supplied from the power side detection/recovery unit 240-b and the second neutral point output and supplied from the load side detection/recovery unit 230-b in a normal state, and thus no current flows. Here, since the lines of power R and N are connected in series to the load, normal power is supplied to the load. Here, if an electrical fault occurs in the line of R phase present between the power side and the load side detection/recovery units 240-b and 230-b, unbalance occurs between the lines of R and N and a potential difference occurs between the first neutral point N1 and the second neutral point N2, so that a voltage or current flows, and in the power side detection/recovery unit 240-b and the load side detection/recovery unit 230-b, a coil having an abnormal voltage is subjected to electromagnetic induction by a coil having a normal voltage through their respective coils L1 and L2, thereby generating fault supplementary power.

Here, an output of about 15 mA of the fault supplementary current for detection, alarming, and interruption may be detected by the fault detector 210, and an electric leakage breaker (ELB), an SSR, a relay, an alarm implemented as the fault detector 210 may be sufficiently driven. Therefore, if the capacity of the detection/recovery units 230 and 240 is 5 VA to 20 VA, fault detection may be possibly performed, a smaller capacity may be used in some cases, and the detection/recovery units 230 and 240 may be used an electric element such as a resistor or a capacitor by configuring and connecting the first neutral point and the second neutral point.

Here, FIG. 8 shows calculation of fault supplementary currents according to load capacity when resistance is increased in any one line of the detection/recovery power distribution system 150. Here, it is assumed that resistance of the line of R phase among power lines of R and N is increased will be described as an example. If power of the power line is 220 V and the neutral point of the power side detection/recovery unit 240-a is configured in the middle of the coil, voltage values of the neutral point and R and the neutral point and N are the same as 110 V and 220 V flows into both ends of the coil. Here, assuming that a load capacity is 1000 W, a current value of the load is A=W/V, so 1000/220=4.545 A, and when the load current value is converted into mA, it is 4,545 mA. Here, since a load resistance R is V/I, R=48.4Ω. At this time, if a line resistance increases by 0.5Ω due to a fault in the R phase, about 1/97 of the load resistance value is occupied by the faulty R phase line resistance and a current of about 47 mA is consumed by the line resistance 0.5Ω (or a neutral point current flowing as a voltage on the load side is stepped down due to the increase in resistance of R phase to recover a normal voltage). With this current, the second neutral point of the load side detection/recovery unit connected to the first neutral point of the power side detection/recovery unit has a 110 V potential on the N line, and when 110 V is induced to the coil L2 of the load side detection/recovery unit connected to the second neutral point and the N line, electromagnetic induction may be generated in the coil L1 wound around the same iron core to supply 220 V, which is a normal voltage, to the load, and the load side detection/recovery unit supplies an insufficient fault supplementary current of about 47 mA to the R-phase load line unbalanced due to an increase in resistance (it is a natural phenomenon that is proved by physical studies that if neutral line N or R line is disconnected or an electrical fault such as a connection failure, abnormal voltage inflow, etc. occurs, unbalance occurs and detection or recovery is performed by outputting supplementary current).

The power distribution system 200 using such a single-phase power includes the load side detection/recovery unit 230-a connected to the load side power line of the distribution line of the detection/recovery power distribution system 150. When the power line supplied from the power line has a fault, the second neutral point N2 is configured in the coil winding of the load side detection/recovery unit 230-a in order to recover, interrupt, alarm, and perform notification, and a voltage of the second neutral point N2 and the first neutral point N1 provided in the power side detection/recovery unit 240-a may be detected or a current is detected by electrically connecting the second neutral point N2 to the first neutral point N provided in the power side detection/recovery unit 240-a. This enables detection or recovery in real time when an increase in resistance, an arc, a disconnection, a contact failure, and a partial wire disconnection occurs in the single-phase two-wire type power line.

In addition, the second neutral point N2 of the load side detection/recovery unit (230-b) electrically connected to the first neutral point N1 of the power side detection/recovery unit 240-b becomes a neutral line in a single-phase three-wire system, so that when a power side disconnection occurs, the second neutral point N2 immediately performs alarming, interruption, or recovery. If the second neutral point N2, which is electrically connected to the first neutral point N1, is also used in a single-phase two-wire system, it serves as a spare line when the power line is disconnected, and when a short circuit occurs at the load side, a short-circuit current is distributed and flows, thereby improving reliability of the system.

Meanwhile, referring to the load side detection/recovery unit 230-b, the load side detection/recovery unit 230 also includes the second neutral point N2 formed between both ends of the input/output coils connected in parallel to the power line of the supply power, and a voltage of the second neutral point N2 and the first neutral point N1 provided in the power side detection/recovery unit 240 is detected or the second neutral point N2 is connected to the first neutral point N1 of the power side detection/recovery unit 240. As a result, when an increase in resistance, an arc, a disconnection, a loose contact, a partial wire disconnection, a short circuit, an abnormal voltage inflow, etc., occurs in the electric line (R, N, etc.) of the detection/recovery power distribution system 150, the load side detection/recovery unit 230-b operates using the second neutral point N2 to perform alarming or interruption or real time recovery.

Here, referring to the recovery process in case of a disconnection of the single-phase two-wire R of the power line, when the electric line R is disconnected on the power side, only one N line remains, and the line N and the first neutral point N1 supply power to the coil L2 of the load side detection/recovery unit 230-b. The coil L2 in association with the first neutral point N1 connected to the second neutral point N2 of the load side detection/recovery unit 230-b electromagnetically induces the coil L1 of the load side detection/recovery unit 230-b and recovers the single-phase two-wire power. When the electric line N is disconnected, only one line of the electric line R exists in the detection/recovery power distribution system 150, and the existing electric line R and the first neutral point N1 of the load side detection/recovery unit 230-b supplies power to the coil L1, and the coil L1 in association with the first neutral point N1 connected to the second neutral point N2 of the load side detection/recovery unit 230-b electromagnetically induces the coil L2 provided in the load side detection/recovery unit 230-b to recover the single-phase two-wire power. Even in the case of an electrical fault such as an increase in resistance, a connection failure (arc), or a partial wire disconnection, the real-time normal voltage is recovered for the same reason.

Figure 10:
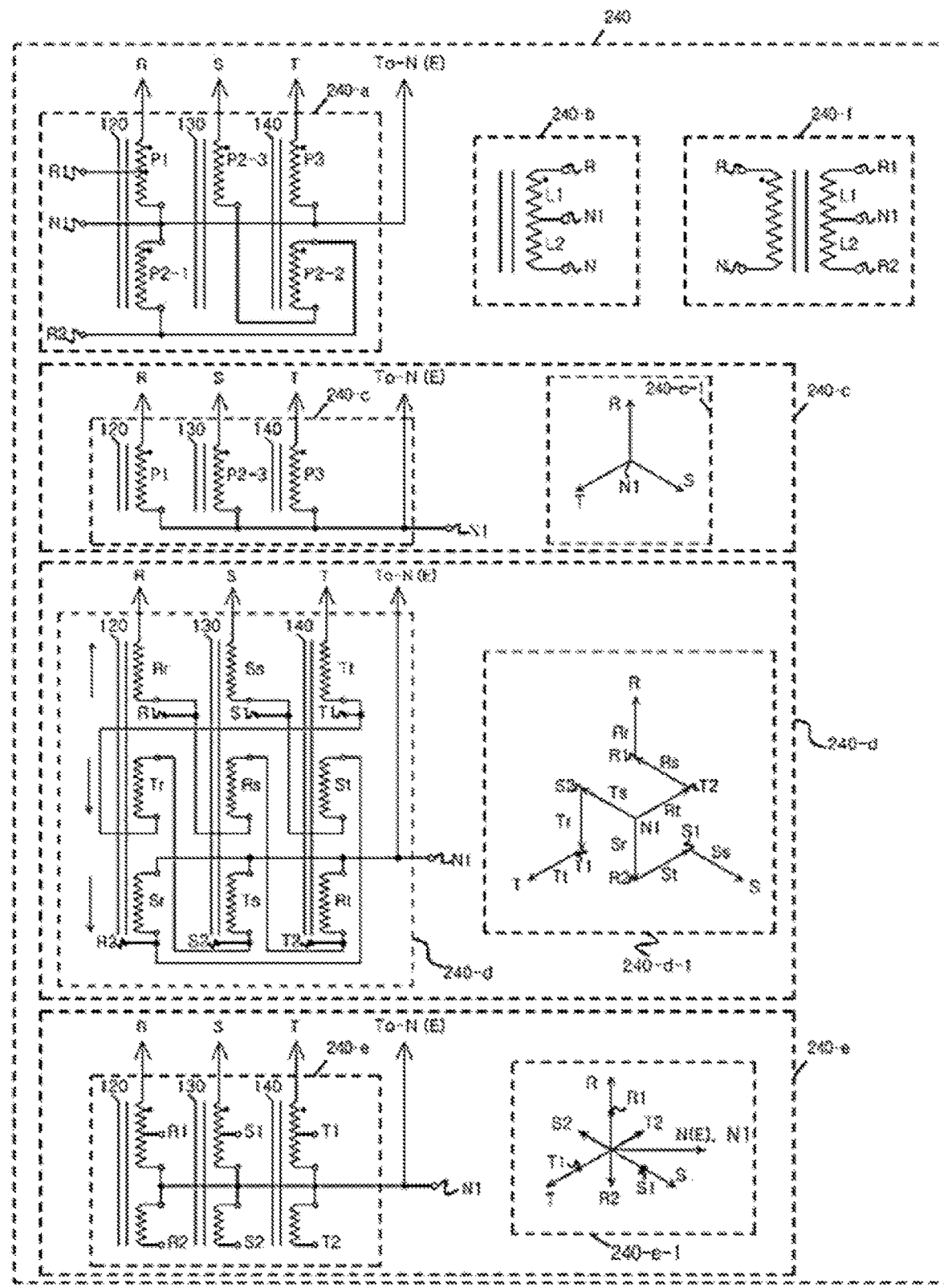
FIG. 10 is a circuit diagram of various embodiments of a power side detection/recovery unit.

In addition, referring to a single-phase power side detection/recovery unit (e.g., 240-f in FIG. 10) among the various embodiments of the power side detection/recovery unit 240 shown in FIG. 10, it may be configured like 200-2 of FIG. 12 by using an insulation transformer (a primary coil and a secondary coil are insulated and wound separately) as shown in 200-2 of FIG. 12. To configure the power side detection/recovery unit 240-f in a detection/recovery circuit, an output capacity of the power side detection/recovery unit 240-f must be higher than a total capacity obtained by adding up the number of loads connected to the power side detection/recovery unit 240-f or the power side detection/recovery unit 240-f having the same capacity must be configured on the power side and the load side detection/recovery unit 230-b is configured to match the capacity of the detection or recovery function on the load side, the first neutral point N1 of the power side detection/recovery unit 240-f and the second neutral point N2 of the load side detection/recovery unit 230-b are connected to each other, the primary coil (R, N) of the power side detection/recovery unit 240-f is connected in series to a power line of the power side, power of the output power lines R1 and R2 of the secondary coils L1 and L2 of the power side detection/recovery unit 240-*f* is supplied to a load equipment, and the coils R1 and R2 of the load side detection/recovery unit 230-*b* are connected in parallel to the power lines R1 and R2 (the contents of recovering or interrupting using an insulating transformer are described in detail with respect to related art 3 in the patent registration publication of the related art document).

Here, when the first neutral point N1, which is the secondary coil, of the power side detection/recovery unit 240-*f* is grounded or connected to the neutral line, a potential difference of the power lines R1 and R2 in which power is supplied to the load from the earth is stepped down than a potential difference to the existing single-phase line so as to be supplied, and when the first neutral point N1 drawn from the secondary coils L1 and L2 of the power side detection/recovery unit 240-*f* is not connected to the earth or the power side neutral line but connected only to the second neutral point of the load side detection/recovery unit 230-*b* to supply power to the load, since there is no current circulation path between the earth and the secondary coil circuits L1 and L2 of the power side detection/recovery unit 240-*f*, the secondary coil circuits L1 and L2 and the earth cannot generate a potential. This fundamentally prevents the occurrence of electric leakage, electric shock, and fire due to electric leakage, and when electrical fault occurs, the load side detection/recovery unit 230-*b* operates to detect the electrical fault or recover the electrical fault in real time to cope with the electrical fault.

In addition, when a short circuit (ground fault) occurs in the power line (R, N, etc.) of the detection/recovery power distribution system 150, a leakage current flows only in the short circuit, so that it may be monitored by the existing method (earth leakage breaker, etc.), and since the leakage current is supplied by recovery power of the load side detection/recovery unit 230-*b*, the leakage current may be detected by monitoring the input/output line of the load side detection/recovery unit 230-*b* by a zero current transformer or by monitoring the N1 line which is the first neutral point connected to the N2 terminal which is the second neutral point of the load side detection/recovery unit 230 by the zero current transformer. Alternatively, it is also possible to detect an electrical fault by voltage without connecting the N2 terminal of the load side detection/recovery unit 230-*b* and the N1 line of the power side detection/recovery unit 240-*b*.

Here, if the voltage is detected at both terminals without connecting the N2 terminal and the N1 terminal of the load side detection/recovery unit 230-*b* by a wire, the voltage may be detected at the N2 terminal and the N1 terminal even in the case of disconnection, contact failure, partial wire disconnection, and unbalance. When the voltage is detected at the N2 terminal and the N1 terminal, the two terminals are immediately connected to recover, immediately interrupt, trigger an alarm, or transmit a detected value to the controller 220. The controller 220 may compare the detected value with a preset value and issue interruption, notification (alarm), or recovery. If a voltage is detected at the N2 and N1 terminals without detection of a leakage current in the line R or N, it is determined as the occurrence of an increase in resistance, an arc, a disconnection, a loose contact, a partial wire disconnection, and an imbalance, and the controller 220 immediately performs recovery by connecting the N2 terminal and the N1 terminal or performs a function of transferring an electrical signal to operate a circuit breaker, an alarm, or a communication module (here, a fault supplementary current is less in case of a slight increase in resistance in a state where there is no leakage current of R and N lines in case of an increase in resistance, a disconnection, or a connection failure, a fault supplementary current which is double a normal current flowing in the load flows because 110 V, rather than 220 V, is supplied in case of a disconnection, and a fault supplementary current irregularly flows according to a load capacity and a connection state in case of a connection failure or a partial wire disconnection, and thus, it is possible to know what kind of fault the electrical fault occurred by applying to the set value and programming it).

Disconnection and open phase recovery in the case of a three-phase four-wire power will be described. In FIGS. 5 and 6, in the power side detection/recovery unit 240-*a*, a first winding P1 wound around a first leg 120 and a third winding P3 wound around a third leg 140 have a voltage ratio of 1:1, and a second winding P2 includes three coil windings, which have a voltage ratio of ½ of the voltage ratio of the first winding and the third winding, wound around the first leg, a second leg, and the third leg, thus providing the windings P1, P2, and P3, which are coils, and the legs 120, 130, and 140, which are iron cores. Also, a neutral point connected in parallel to power lines R, S, and T supplying three-phase power to a load and outputting a first neutral point N1 and a second neutral point N2 of the load side detection/recovery unit 230-*a* connected to the neutral point are illustrated.

FIG. 10 shows various embodiments of the power side detection/recovery unit 240. 240-*a* denotes a power side detection/recovery unit used in the three-phase three-wire and three-phase four-wire systems of FIGS. 5 and 6, 240-*b* denotes another embodiment of the power side detection/recovery unit 240 of FIG. 3, having a structure for use in single-phase (two-wire, three-wire), 240-*c* denotes a power side detection/recovery unit 240 used in the three-phase and three-wire and three-phase and four-wire systems, generating and maintaining a first neutral point similar to equipotential with the earth (neutral line) on the power side in the case of three-phase power, and moving a position of a provided first neutral point (equipotential) to have a potential difference with the earth in case of an electrical fault (a disconnection, an open phase, an abnormal voltage, an incorrect wire connection, etc.), 240-*d* denotes a power side detection/recovery unit 240 connected to a three-phase four-wire power system to recover an electrical fault (disconnection, open phase, abnormal voltage, incorrect wire connection, etc.), stepping down a potential difference of single-phase power (R1, R2.S1, S2.T1, T2) supplied to a load and supplying the same, and resolving unbalance using all of three-phase currents when a single-phase load is used in one phase (one circuit), and 240-*e* denotes a power side detection/recovery unit 240 connected to a three-phase 4-wire power system and formed by applying a coil to a general Y connection circuit capable of supplying power by stepping down a potential difference of single-phase power (R1, R2.S1, S2.T1, T2) supplied to a load.

Figure 11:
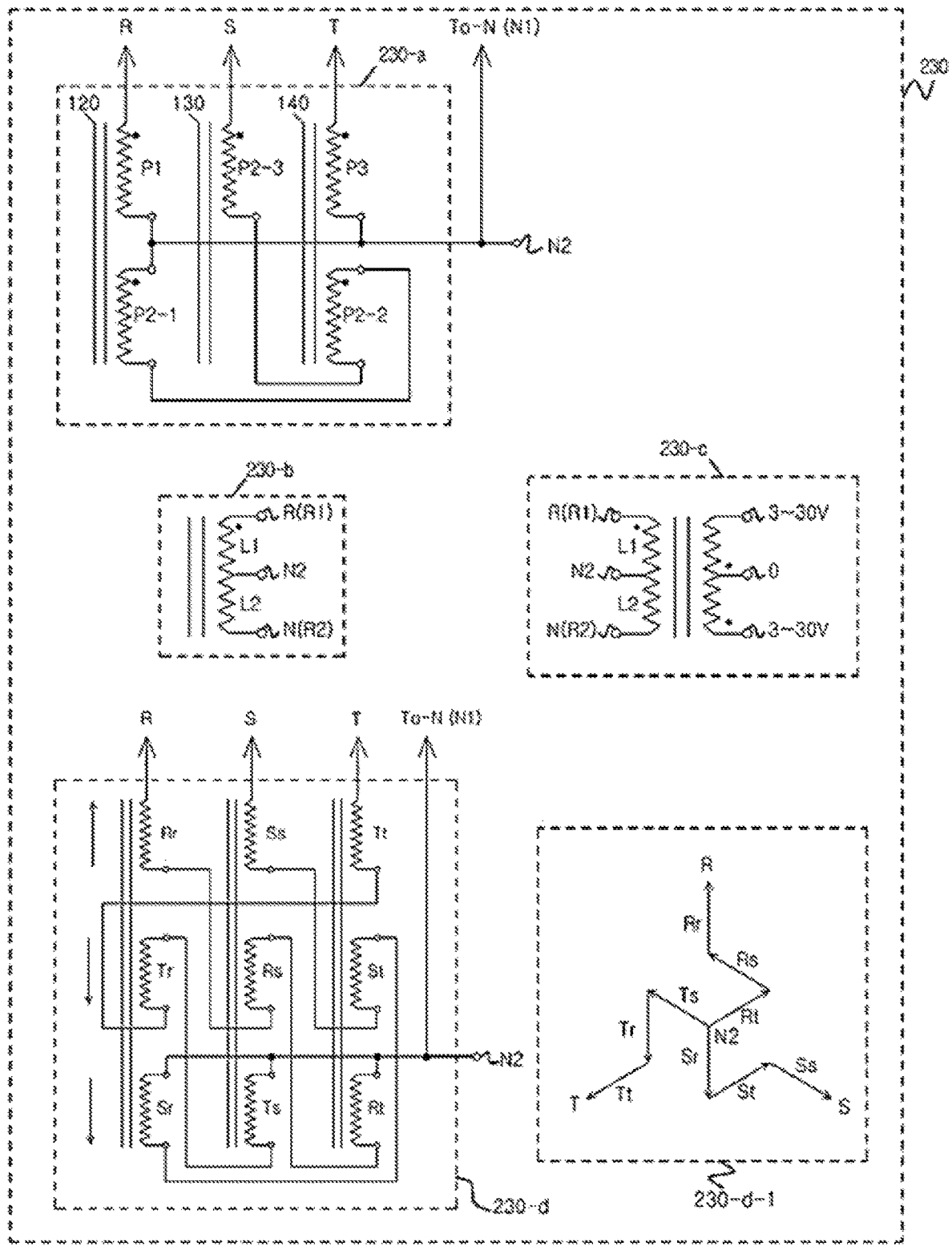
FIG. 11 is a circuit diagram of various embodiments of a load side detection/recovery unit.

FIG. 11 shows various embodiments of the load side detection/recovery units 230 and 240. 230-*a* denotes a load side detection/recovery unit used in a three-phase three-wire system and a three-phase four-wire system, 230-*b* is another embodiment of the load side detection/recovery unit 230 of FIG. 3, having a structure to be used in a single-phase (two-wire type, three-wire type), 230-*c* denotes a load side detection/recovery unit 230 that detects a fault upon receiving commercial power from a primary coil and transforms a voltage to a low voltage in the load side detection/recovery unit (e.g., 230-*c* in FIG. 11) to supply a low voltage to an electronic circuit or the like from a secondary coil, and 230-*d* is a load side detection/recovery unit 230 that allows harmonics or noise occurring in a three-phase three-wire or three-phase four-wire nonlinear load equipment and flowing to a neutral point to pass therethrough so as to be canceled, and that is used when an unbalance needs to be corrected in a balancing direction.

Figure 9:
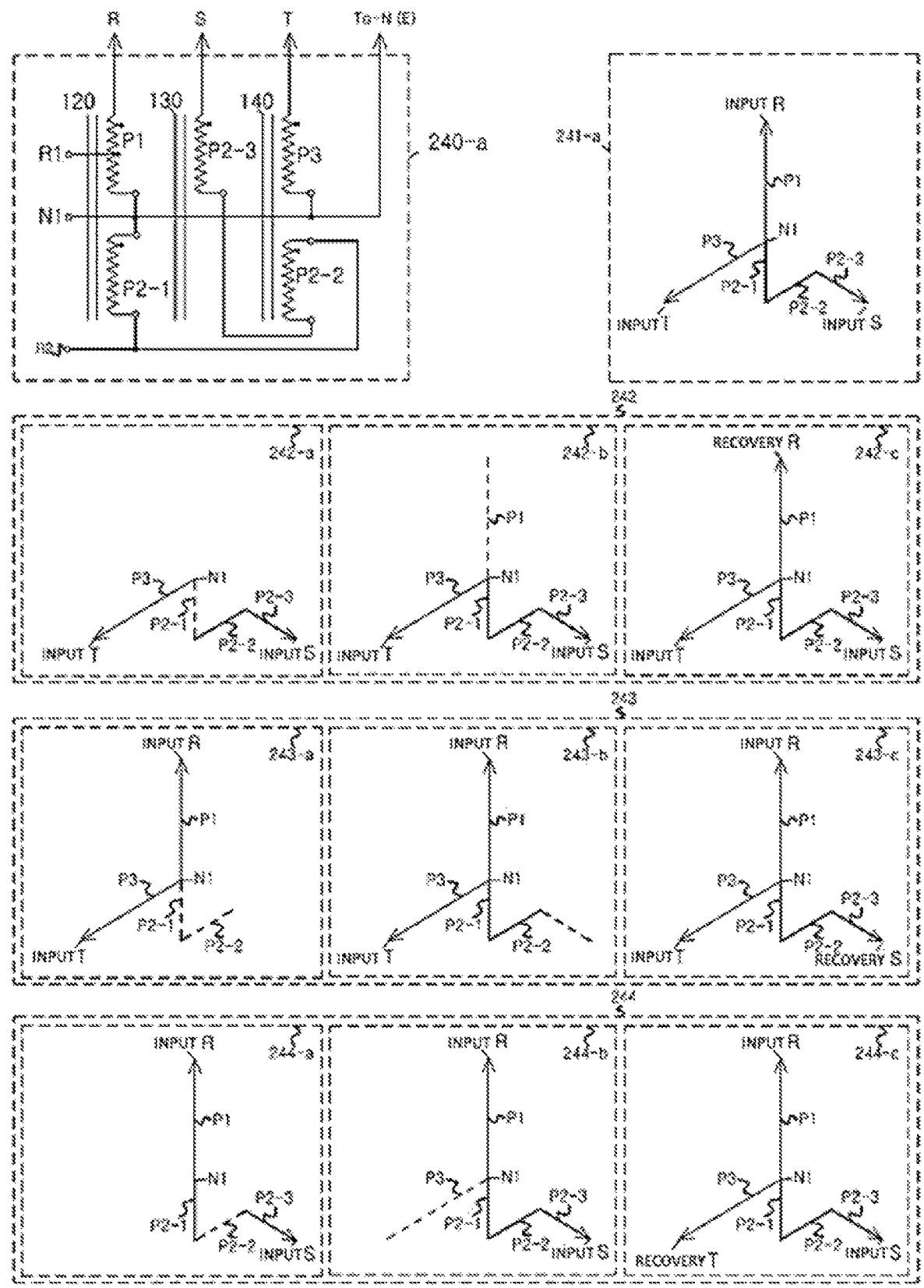
FIG. 9 is a circuit diagram and vector diagram of a detection/recovery unit for explaining a power recovery principle (sequence) of a power side detection/recovery unit when a three-phase three-wire or three-phase four-wire system is disconnected, in which Vector diagram 241-a is a phase vector diagram at the time of normal power input of a power side detection/recovery unit 240-a, Vector diagram 242 is a vector diagram of a recovery sequence when input power R phase is disconnected or open-phased, Vector diagram 243 is a vector diagram of a recovery sequence when input power S phase is disconnected or open-phased, and Vector diagram 244 is a vector diagram of a recovery sequence when input power T phase is disconnected or open-phased.

In FIG. 9, a vector diagram 241-*a* in a normal state of the power side detection/recovery unit 240-*a* and recovery vector diagrams 242, 243, and 244 in case of a disconnection and an open phase are described. Recovery will be described with reference to FIG. 9. A vector diagram 243-*a* is a vector diagram in a state in which an input S phase has disappeared. When the input S phase becomes extinct, power of the coil winding P2 (P2-1, P2-2, P2-3) disappears and only an input R phase, an input T phase, and the neutral line N maintaining a phase angle of 120 degrees from each other are powered. A voltage of the input R phase is applied to one end of the winding (coil) P1 having the other end connected to the neutral line N, and a phase voltage in a direction opposite 180 degrees to the phase of the voltage induced to the winding P1 based on the neutral point N is generated by electromagnetic induction in the winding P2-1 wound in the opposite direction of the winding P1 around the leg 120 which is the same as the first leg 120 which is an iron core around which the winding P1 is wound, so that a phase vector in a state of 243-*a* appears. Meanwhile, if an input voltage having a phase difference of 120 degrees with the input R phase is 380V, the input T phase having a 200V potential difference and position with the 380V potential difference and the neutral line N is connected to one end of the winding P3 having the other end connected to the neutral line and power is applied thereto, and a phase voltage in a direction opposite by 180 degrees of the phase of the voltage induced to the winding P3 based on one end of P2-1 having the other end connected to the neutral point N is generated by electromagnetic induction in the winding P2-2 wound in the opposite direction of the winding P3 around the leg 140 which is the same as the third leg 140 around which the winding P3 is wound, so that a phase vector in a state of 243-*b* appears. Meanwhile, in the winding P2-3 wound around the second leg, a magnetic flux of the electromagnetically induced phase (R, T) from the first leg 120 and the third leg 140 is added to form a magnetic flux of an S phase at the second leg and induce a voltage of S phase in a state of 243-*c* to the winding P2-3. Here, the other end of winding P2-1 is connected to the neutral point, one end of winding P2-1 and the other end of winding P2-2 are connected by reverse V connection, and the other end of P2-3 is connected to one end of P2-2 in the form of Y connection, so that the power input S phase, which disappeared, is generated at one end of P2-3 to recover the input S phase like 243-*c*.

In addition, as in the vector diagram 244-*a* of FIG. 9, when the T phase is disconnected and disappears, only power of the input R phase, the input S phase, and the neutral line N is input to the coil windings P1, P2 and a phase voltage in the opposite direction of P1 is formed to appear in the winding P2-1 which is wound around the leg 120 which is the same as the coil winding P1 reversely and has the other end connected to the neutral point or the neutral line N. In addition, the S phase input to the coil winding P2-3 maintains a potential of 380V with a phase angle of 120 degrees with the R phase and maintains a potential of 220 V with the neutral line, and at this position, when a voltage of the S phase is input to one end of the coil winding P2-3, the phase of the S phase is formed at the coil winding P2-3. Here, the phase voltage of the T phase is induced to the coil winding P2-2 connected between the other end of the coil winding P2-3 and one end of the wound coil winding P2-1 and wound around the third leg and electromagnetically induces the coil winding P3 wound around the third leg together as in the diagram 244-*b*, and the phase voltage of the T phase is recovered to appear in the coil winding P3 as shown in 244-*c*. Similarly, in the vector diagram 242-*a*, when the input R phase is disconnected to disappear, a voltage of the same phase as the coil P3 is induced to the coil P2-2 wound around the third leg 140 which is the same as the coil P3 by the coil P3 of the input T phase, the S phase maintains the potential of 380V with the phase angle of 120 degrees with the T phase and maintains the potential of 220 V with the neutral line, and at this position, when the voltage of S phase is input to one end of the coil winding P2-3, the phase of S phase is formed at the coil winding P2-3. Here, as in the diagram 242-*b*, a voltage of R phase is induced to the coil winding P2-1 having the other end connected to the neutral line and one end connected to the coil winding P2-2, and as a result, an opposite voltage of the voltage of the R phase induced to the coil winding P2-1 is formed at the coil winding P1 wound around in the opposite direction on the first leg 120 which is the same as the coil winding P2-1 in the first leg to appear as in the diagram 242-*c*, and as a result, the input R phase is restored to its original state.

In addition, as mentioned above, by installing a fault detector 210 at the neutral point N2 of the load side detection/recovery unit 230 to detect an occurrence of an electrical fault such as an increase in resistance, an arc, a disconnection, a short circuit, a loose contact, a partial wire disconnection, and the like, and when the electrical fault is detected, the electrical fault may be alarmed or interrupted or transferred to the controller 220 or the CCMS 280 so as to be recovered or fault electricity may be remotely interrupted or informed to the outside wiredly or wirelessly to perform alarming. Alternatively, it is possible to use only the fault detector 210 to interrupt or alarm without the controller 220.

Interrupting or alarming without the controller 220 will be described in detail. When an electrical fault such as an increase in resistance, an arc, a disconnection, a loose contact, a partial wire disconnection, etc. occurs, a voltage and a current are generated at the second neutral point N2, the neutral line N, or the first neutral point provided in the load side detection/recovery unit 230. Here, when power is cut off by operating an electric leakage breaker, when the generated voltage is cut off by operating a trip coil implemented as the fault detector 210, or when the SSR detects the electrical fault and operates, the SSR may operate the trip coil using a switch provided therein to interrupt the circuit breaker 270 or operate the alarm generator 250 and may immediately connect the neutral point N2 terminal, the neutral line N terminal, or the first neutral point terminal provided in the load side detection/recovery unit 230 to recover the electrical fault. Also, after the neutral point N2, the neutral line N, or the first neutral point is connected, when a flowing voltage or current is detected by the fault detector 210, whether recovery has been performed or not may be informed to the outside, and if recovery has not been performed, the flowing voltage or current may be cut off.

Here, as for a method of detecting power side disconnection, loose contact, partial wire disconnection by the fault detector 210, 1) a voltage or current of the neutral line N or the first neutral point N1 and the second neutral point N2 that may be generated when an increase in resistance, a disconnection, a loose contact, a partial wire disconnection, an open phase, and an imbalance is detected, 2) a current detection value of an electric line which is a single-phase two-wire power line (R, N, etc.) is detected, and if R+N=0, the detection/recovery power distribution system 150 is determined to be normal, and if R+N≠0 is detected, it is determined that detection/recovery power distribution system 150 is abnormal. Similarly, in case of an electric leakage, 1) a voltage or a current of the neutral line N or the first neutral point N1 and the second neutral point N2 may be detected and 2) a current detection value of the single-phase two-wire electric line is detected, and when R+N=0, the detection/recovery power distribution system 150 is determined to be normal, and when R+N≠0 is detected, the detection/recovery power distribution system 150 may be determined to be abnormal (the case of three-phase (R+S+T=0 is normal, R+S+T≠0 is failure) is the same, and thus, a detailed description will be omitted). If it is determined that a fault has occurred, it is immediately interrupted through an earth leakage breaker (within 0.03 seconds), an alarm is issued through the fault detector, the breaker 270 is interrupted or restored, or the detected value is transferred to the controller 220, so that the controller 220 may remotely send a breaker interrupt signal, performing alarming or recovery, or notify the manager about the occurrence of the fault through a communication module wiredly or wirelessly.

Here, as the controller 220, an existing relay equipped with a microcomputer function, an earth leakage alarm, and the like may be used, and communication equipment provided in an existing facility may be used. However, in the present disclosure, preferably, the controller 220 is implemented as a microcomputer, a microprocessor, a central processing unit, a microcontroller, and the like that is able to control an overall operation of the power distribution system 200.

Meanwhile, as described above, when an abnormal voltage occurs in the neutral points N, N1, and N2 due to an electrical fault such as an increase in resistance of a power line, occurrence of an arc, a loose contact, a partial wire disconnection, an electric leakage, or a short circuit or when it is determined that an abnormal current flows in the neutral points N, N1, and N2, the controller 220 immediately operates the circuit breaker 270 or drives the alarm generator 250. The alarm generator 250 triggers an alarm and reports the electrical fault such as the increase in resistance, arc occurrence, disconnection, loose contact, partial wire disconnection, short circuit or unbalanced power. In the present disclosure, alarming may be performed using a visual and/or audible alarm method in a wired manner, or the electrical fault may be remotely monitored using a bi-directional communication module (RTU, etc.) which is an existing technology or the controller 220 may be controlled remotely in a wireless manner. In a state where visual and/or audible alarming or wireless notification is generated, when the manager recognizes it, the manager may take follow-up measures promptly, and accordingly, various electric accidents that may occur due to an increase in resistance of a power line, an arc, a disconnection, a loose contact, a partial wire disconnection, an electric leakage, a short circuit, or unbalanced power may be prevented.

The manager may release the generated alarm as necessary. For example, when an alarm release switch provided in the alarm release input unit 260 is operated, an alarm release signal is generated by the alarm release input unit 260 and transmitted to the controller 220. When the alarm release signal is transmitted, the controller 220 stops the operation of the alarm generator 250 to release the alarm (remote monitoring and control are possible through wired/wireless communication using existing technology).

In addition, in the present disclosure, the fault detector 210 detects occurrence of an electrical fault such as an increase in resistance, an arc, a disconnection, a loose contact, a partial wire disconnection, an electric leakage, a short circuit, or unbalanced power. When the electrical fault occurs, the fault detector transfers a high signal to the controller 220, and in a normal case, the fault detector transfers a low signal to the controller 220. The controller 220 compares the received signal with a preset value to determine a fault and immediately recovers, alarms, interrupts as determined or informs the manager wiredly or wirelessly to thereby prevent social disasters caused by electric accidents such as operation paralysis of an automatic switch, power failure, electric shock, control stop, overheating burnout, and fire that may occur due to the electrical fault.

In addition, the present disclosure, as known, even after the electrical fault due to the increase in resistance, arc, disconnection, loose contact, or partial wire disconnection is restored by operating the load side detection/recovery unit 230, the occurrence of the electrical fault such as increase in resistance, arc, disconnection, loose contact, or partial wire disconnection is continuously detected through the fault detector 210, and here, in case of the electrical fault such as a detection of an electric leakage, an increase in resistance, a disconnection, a loose contact, or a partial wire disconnection due to an abnormal voltage or current at the power line or the neutral point even after recovery was performed by the load side detection/recovery unit 230, the controller 220 automatically operates the circuit breaker (MCCB, ELB, others, etc.) using a control signal, or performs alarming or notification wiredly or wirelessly to prevent automatic switch paralysis, power failure, electric shock, overheating burning damage, and fire occurrence.

For example, according to the present disclosure, by automatically performing recovery of fault power upon disconnection at the power side of the power distribution system, the occurrence of a power failure caused by disconnection may be prevented, and in case of an increase in resistance, a disconnection, an open phase, a loose contact, and/or a partial wire disconnection, recovery is performed to prevent tracking, spark, short circuit, electric leakage (ground fault), insulation breakdown, burning damage, overheating, and an electric fire of an electric device, and in addition, it is possible to prevent accidents caused by an electrical fault by detecting the occurrence of a short circuit on the power side, which is the blind spot of the existing technology, and reducing electric shock and electric fire due to the electric leakage.

In addition, in case of failure in fault power recovery, the circuit breaker is operated by generating a circuit breaker operation control signal and informed (alarmed), thereby preventing damage to a rear stage device due to an overcurrent or abnormal voltage or social disasters such as electric shock or fire due to an electrical fault.

The power distribution system 200 of the present disclosure may be implemented as a single module so as to be commercialized. As a result, the power distribution system 200 as a module may automatically check abnormal conditions in places where visual inspection is impossible (increase in resistance, arc, loose contact, partial wire disconnection, etc. of embedded wiring and connection points, circuit breakers, switches, contact terminals of automatic switches) or may be installed in a distribution panel or a switchgear to perform alarming, interrupt power in case of abnormal power in association with a circuit breaker, may be installed in an outlet, installed in an electric device or home appliance, or may be easily applied to a power supply device which is already installed to alarm or interrupt an abnormal state or abnormal power of lines or perform real-time electricity fault recovery.

The present invention is not limited to the embodiments described above and various modifications may be made by a person skilled in the art to which the present invention pertains, without departing from the spirit of the invention as defined by the claims of the present invention, and such modifications also fall within the claims.

What is claimed is:

1. A power distribution system for detecting and repairing all electrical faults, the power distribution system comprising:
   at least one of a power side recovery unit connected in parallel to a power side of a power line and a neutral line and a load side recovery unit connected in parallel to a load side in which the power line and the neutral line are connected to a load,
   wherein at least one of load equipments connected to the power line and the neutral line is configured to be linked to the load side recovery unit, so that when an electrical fault due to an arc, an increase in resistance, a disconnection, an open phase, unbalanced power, a connection failure, an incorrect wire connection, electric leakage, or a short circuit occurs in any one of an electrical equipment, the power line, the neutral line, and the power side recovery unit, the load side recovery unit detects the electrical fault according to a location of a faulty section, a fault place, and a fault circuit where the electrical fault occurs; and performs at least one of recovery, breaking, alarming, notification, monitoring, and control on the location of the faulty section where the electrical fault occurs.

2. The power distribution system of claim 1, wherein when the power distribution system, which is the electrical equipment, is a three-phase power distribution system, the recovery unit includes iron cores which are a first leg, a second leg, and a third leg and a first winding, a second winding, and a third winding which are coils, the first winding is wound around the first leg, the second winding is wound around the second leg, and the third winding is wound around the third leg, a Y connection is made, and a common line is configured as a neutral point, one end of each of the first winding, the second winding, and the third winding is connected to the power line in parallel, the neutral point is linked to at least one of earth, a neutral line, a first neutral point, a second neutral point, and a fault detector to detect, break, or recover the electrical fault of the electrical equipment, the power side recovery unit has a primary coil, the power line, the neutral point outputs power supplying a single-phase two-wire type, three-phase three-wire type, and three-phase four-wire type, a single-phase supply power is output by stepping down an earth voltage.

3. The power distribution system of claim 1, wherein, when the power distribution system is a three-phase power distribution system, the power side recovery unit or the load side recovery unit includes iron cores which are a first leg, a second leg, and a third leg and a first winding, a second winding, and a third winding which are coils, the first winding and the second winding are wound around the first leg, the second winding is wound around the second leg, and the third winding and the second winding are wound around the third leg, one end of each of the first winding, the second winding, and the third winding are connected in parallel to the power line provided in the electrical equipment and an other end of each of the first winding, the second winding, and the third winding are connected by a common line to configure a neutral point, and the neutral point is linked to at least one of earth, a neutral line, a first neutral point, a second neutral point, and a fault detector to detect, break, or recover the electrical fault of the electrical equipment.

4. The power distribution system of claim 1, wherein, when the power distribution system is a three-phase power distribution system, the power side recovery unit or the load side recovery unit includes iron cores which are a first leg, a second leg, and a third leg and a first winding, a second winding, and a third winding which are coils, the first winding is wound around the first leg in a forward direction and the second winding is wound around the first leg in a reverse direction, the second winding is wound around the second leg in the forward direction, the third winding is wound around the third leg in the forward direction and the second winding is wound around the third leg in the reverse direction, one end of each of the first winding, the second winding, and the third winding are connected in parallel to the power line provided in the electrical equipment and an other end of each of the first winding, the second winding, and the third winding are connected by a common line to configure a neutral point, and the neutral point is linked to at least one of earth, a neutral line, a first neutral point, a second neutral point, and a fault detector to detect, break, or recover the electrical fault of the electrical equipment.

5. The power distribution system of claim 1, wherein, when the power distribution system is a three-phase power distribution system, the power side recovery unit or the load side recovery unit includes iron cores which are a first leg, a second leg, and a third leg and a first winding, a second winding, and a third winding which are coils, the first winding and the second winding are wound around the first leg, the second winding is wound around the second leg, and the third winding and the second winding are wound around the third leg, one end of each of the first winding, the second winding, and the third winding are connected in parallel to the power line provided in the electrical equipment and an other end of each of the first winding, the second winding, and the third winding are connected by a common line to configure a neutral point, the neutral point is linked to at least one of the earth, a neutral line, a first neutral point, a second neutral point, and a fault detector, and a circuit breaker is provided between the power side recovery unit and the load side recovery unit or between the electrical equipment and the load side recovery unit.

6. The power distribution system of claim 1, wherein, when the power distribution system is a three-phase power distribution system, the power side recovery unit or the load side recovery unit includes iron cores which are a first leg, a second leg, and a third leg and a first winding, a second winding, and a third winding which are coils, the first winding is wound around the first leg in a forward direction and the second winding is wound around the first leg in a reverse direction, the second winding is wound around the second leg in the forward direction, the third winding is wound around the third leg in the forward direction and the second winding is wound around the third leg in the reverse direction, one end of each of the first winding, the second winding, and the third winding are connected in parallel to the power line provided in the electrical equipment and an other end of each of the first winding, the second winding, and the third winding are connected by a common line to configure a neutral point, the neutral point is linked to at least one of earth, a neutral line, a first neutral point, a second neutral point, and a fault detector, and a voltage ratio of a coil voltage of the second winding, which is separately wound as three windings around the first leg, the second leg, and the third leg, with respect to the first winding and the third winding is ½.

7. The power distribution system of claim 1, wherein, a first neutral point is configured in the power side recovery unit and a second neutral point is configured in the load side recovery unit, and in case of the electrical fault, a potential difference is generated in any two of the neutral line of the electrical equipment, the first neutral point of the power side recovery unit, and the second neutral point of the load side recovery unit, a current is generated by connecting any two of the neutral line, the first neutral point, and the second neutral point, or a current flowing in the power line connected between the electrical equipment and the load side recovery unit or the power line connected between the power side recovery unit and the load side recovery unit is generated as unbalanced current so that a fault detector performs at least one of detection, interruption, alarming, and recovery.

8. The power distribution system of claim 7, wherein, the fault detector detects voltages of any two of the first neutral point, the second neutral point, the neutral line, and earth or detects a current by connecting the any two of the first neutral point, the second neutral point, the neutral line, and the earth to detect an electrical signal generated in case of the electrical fault, and when an occurrence of the electrical fault is detected, the fault detector alarms through an alarm generator, interrupts through a circuit breaker, controls through a controller, or recovers to a normal power through the power side recovery unit or the load side recovery unit.

9. The power distribution system of claim 1, wherein, when the electrical fault occurs in the electrical equipment, the power line, the neutral line, or the power side recovery unit, a magnitude of a fault supplementary power generated in a neutral point of the recovery unit differs according to a kind of the electrical fault, a fault state, a degree of the fault, and a capacity of the load.

10. The power distribution system of claim 1, wherein the recovery unit is provided in each of power lines to which the electrical equipment is connected, provided by section, provided by place, or provided to be linked by the electrical equipment, so that detection or recovery range is limited based on a section and place where the recovery unit is provided and an installation location or the electrical fault from a location where the recovery unit is installed to a main voltage transformer provided at the electrical equipment is detected or recovered.

11. The power distribution system of claim 1, wherein, in case of the electrical fault due to an increase in resistance, an arc, a disconnection, or an open phase occurs in an R phase, an S phase, or a T phase or a neutral line N in power flowing into the power line from the electrical equipment due to lightning, a short circuit, a ground fault, equipment burning damage, or fuse break in the electrical equipment or the power side recovery unit, the recovery unit performs detection or recovery and supplies normal power to the load.

12. The power distribution system of claim 1, wherein, the power side or load side recovery unit is provided in parallel on the power line regardless of capacity of the load, supply power to the electrical equipment without interruption regardless of a fault of the recovery unit, and performs detection, alarming, interruption, and control in an event of a self-fault due to a coil disconnection, an increase in resistance, occurrence of an arc, an incorrect wire connection, occurrence of an abnormal voltage, an electric leakage, and insulation deterioration.

13. The power distribution system of claim 1, wherein, the recovery unit electrically and electronically connected in parallel to the power line and the neutral line connecting a single-phase or three-phase power supply and the load is configured by connecting a first neutral point of the power side recovery unit and a second neutral point of the load side recovery unit by an inductor or an electronic element regardless of capacity of the load, and in case of the electrical fault, the electrical fault is immediately interrupted by generating a voltage or a current from the first neutral point and the second neutral point or by generating a voltage or a current from a neutral point or the neutral line or is detected through a fault detector.

14. The power distribution system of claim 1, wherein, the electric circuit is configured and connected by dividing the recovery unit according to a capacity, function, installation location, and installation quantity of the electrical equipment connected to the power line, a current in a divided section is detected to prevent malfunction during a normal operation, and in case of the electrical fault, the recovery unit is connected to a place where a faulty section, a fault place, and a fault location of the electrical equipment are to be recognized, and generates an electrical signal from a neutral point so that a fault electrical equipment is specified.

15. The power distribution system of claim 1, wherein, the power side recovery unit is connected to a three-phase four-wire type electrical equipment to supply power by removing a neutral line at a time of supplying single-phase power to interrupt zero harmonic and noise flowing into the electrical equipment at the neutral line by a non-linear single-phase load, prevent inflow of an unbalanced overvoltage when the neutral line is disconnected, resolve three-phase unbalance due to a single-phase load by using power of three phases together when supplying single-phase power, thereby preventing malfunction of the power distribution system and burning damage, overheating, and a fire of the electrical equipment.

16. The power distribution system of claim 1, comprising:
the power side recovery unit having a first neutral point and connecting the first neutral point to a neutral line provided in the electrical equipment or connecting the first neutral point to a second neutral point of the load side recovery unit;
the load side recovery unit having the second neutral point and connecting the second neutral point to the first neutral point of the power side recovery unit or a neutral line provided in the electrical equipment to interrupt, detect, or recover the electrical fault on the power side, wherein the load side recovery unit is provided to be linked according to an installation location of the electrical equipment or at least load side recovery unit is provided for each floor or each electrical equipment to distinguish a section, a place, and a circuit location in case of a fault;

a fault detector separately detecting input/output currents of the power line or a neutral point distinguished in the section, the place, and the location, separately detecting a voltage or a current of the neutral point and the neutral line or of the first neutral point and the second neutral point and performing alarming or breaking, or transferring a detected fault detection value including a self- location to a controller;

the controller comparing the detected fault detection value provided from the fault detector with a preset value and performing alarming, interruption, recovery, notification, monitoring, or control corresponding to a fault location or performing control in association with an RTU communication module when the fault is determined;

an alarm generator generating an alarm according to an alarm signal provided from the fault detector or the controller;

an alarm release input unit releasing alarm issuance of the alarm generator; and a circuit breaker interrupting fault power according to an interrupt signal from the fault detector or the controller.

17. The power distribution system of claim 1, wherein when the power distribution system is a single-phase power distribution system, the recovery unit has an iron core which is a first leg and a first winding which is a coil, the first winding is wound around the first leg, one end of the first winding is connected in parallel to the power line and an other end thereof is connected in parallel to the neutral line, a neutral point which is a tab or a common line is configured between one end and the other end of the first winding, the neutral point is linked to at least one of the neutral line, a first neutral point, a second neutral point, and a fault detector to detect, break, or recover the electrical fault of the electrical equipment, the recovery unit has a primary coil, and single-phase power is output from the power line and the neutral line, a potential difference of the single-phase power is stepped down and supplied to the load or power is supplied from the single-phase power so that an earth voltage does not occur, thereby preventing an electric leakage, an electric shock, and a fire.

18. The power distribution system of claim 1, wherein, when the power distribution system is a single-phase power distribution system, the power side recovery unit or the load side recovery unit has an iron core which is a first leg and a first winding which is a coil, the first winding is wound around the first leg, one end of the first winding is connected in parallel to the power line provided in the electrical equipment and an other end thereof is connected in parallel to a neutral line, a neutral point which is a tab or a common line is configured between one end and the other end of the first winding, the neutral point is linked to at least one of the neutral line, a first neutral point, a second neutral point, and a fault detector to detect, break, or recover the electrical fault of the electrical equipment.

19. The power distribution system of claim 1, wherein, when the power distribution system is a single-phase power distribution system, the power side recovery unit or the load side recovery unit has an iron core which is a first leg and a first winding and a second winding which are coils, the first winding and the second winding are wound around the first leg, one end of the first winding is connected in parallel to the power line provided in the electrical equipment and an other end of the second winding is connected in parallel to a neutral line, an other end of the first winding and one end of the second winding are connected to each other to configure a neutral point which is a common line, and the neutral point is linked to at least one of the neutral line, a first neutral point, a second neutral point, and a fault detector to detect, break, or recover the electrical fault of the electrical equipment.

20. The power distribution system of claim 1, wherein, when the power distribution system is a single-phase power distribution system, the power side recovery unit or the load side recovery unit has an iron core which is a first leg and a first winding which is a coil, the first winding is wound around the first leg, one end of the first winding is connected in parallel to the power line provided in the electrical equipment and an other end thereof is connected in parallel to a neutral line, a neutral point which is a tab or a common line is configured between one end and the other end of the first winding, the neutral point is linked to at least one of the neutral line, a first neutral point, a second neutral point, and a fault detector, and a circuit breaker is provided between the power side recovery unit and the load side recovery unit.

21. The power distribution system of claim 1, wherein, when the power distribution system is a single-phase power distribution system, the power side recovery unit or the load side recovery unit has an iron core which is a first leg and a first winding which is a coil, the first winding is wound around the first leg, one end of the first winding is connected in parallel to the power line provided in the electrical equipment and an other end thereof is connected in parallel to a neutral line, a neutral point, which is a common line, is configured between the one end and the other end of the first winding, and the neutral point is linked to at least one of the neutral line, a first neutral point, a second neutral point, and a fault detector to include a coil which is the winding that outputs a corresponding voltage or current in case of the electrical fault of the electrical equipment.

22. A construction method of a power distribution system for preventing an electric shock, a fire, and power failure in case of an electrical fault due to an arc, an increase in resistance, a disconnection, an open phase, unbalanced power, a connection failure, an incorrect wire connection, an abnormal voltage, an electric leakage, or a short circuit in a transformer, a switchboard, a control panel, a distribution panel, a molded case circuit breaker (MCCB), a circuit breaker, an outlet, a power line, a neutral line, and a load equipment, the construction method comprising:

step a) in which a power side recovery unit connected in parallel to a power side of the power line provided in a plurality of electrical equipment configures a first neutral point, a load side recovery unit connected to a load side of the power line configures a second neutral point, and at least two of the recovery units are installed to be linked to the electrical equipment according to an installation place, an installation section, a circuit location, and an equipment function;

step b) in which the first neutral point of the power side recovery unit is connected to the second neutral point of the load side recovery unit, the first neutral point of the power side recovery unit is connected to a neutral line of the electrical equipment, or the neutral line of the electrical equipment is connected to the second neutral point of the load side recovery unit, and in case of the electrical fault, the recovery unit generates a voltage or a current from a neutral point, and in order to interrupt or detect the electrical fault between any two of the electrical equipment, the power side recovery unit, and the load side recovery unit to which the power line or the neutral point is connected, a recovery power distribution system is configured by installing an electric leakage breaker (ELB) or a fault detector at the power line; and step c) in which when the fault detector in the recovery power distribution system detects the electrical fault that occurs in the electrical equipment connected to each other by the power line and the neutral line, in the recovery unit, or in the power line or the neutral line and informs a controller about a faulty section, a fault place, and a fault location, the controller is installed to perform at least one of recovery, interruption, alarming, notification, and control by performing comparing and determining with a preset value.

* * * * *